United States Patent
Kim et al.

(10) Patent No.: US 9,980,398 B2
(45) Date of Patent: May 22, 2018

(54) PRINTED CIRCUIT BOARD AND DISPLAY APPARATUS INCLUDING THE SAME

(71) Applicant: Samsung Display Co., Ltd., Yongin-si, Gyeonggi-Do (KR)

(72) Inventors: Byoungyong Kim, Seoul (KR); Inseok Yeo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/365,920

(22) Filed: Nov. 30, 2016

(65) Prior Publication Data
US 2017/0332495 A1    Nov. 16, 2017

(30) Foreign Application Priority Data
May 10, 2016    (KR) ........................ 10-2016-0057177

(51) Int. Cl.
| H05K 5/00 | (2006.01) |
| H05K 1/11 | (2006.01) |
| H05K 1/18 | (2006.01) |
| H05K 3/32 | (2006.01) |

(52) U.S. Cl.
CPC .......... *H05K 5/0017* (2013.01); *H05K 1/111* (2013.01); *H05K 1/115* (2013.01); *H05K 1/181* (2013.01); *H05K 3/323* (2013.01); *H05K 2201/10128* (2013.01)

(58) Field of Classification Search
CPC ...... H05K 5/0017; H05K 1/111; H05K 1/115; H05K 1/181; H05K 3/323; H05K 2201/10128
USPC ... 361/679.01, 748, 749, 751, 752, 757, 760
See application file for complete search history.

(56) References Cited

U.S. PATENT DOCUMENTS

2012/0306047 A1    12/2012   Liao et al.

FOREIGN PATENT DOCUMENTS

| JP | 2002-353615 A | 12/2002 |
| JP | 2004-095756 A | 3/2004 |
| JP | 2004-356339 A | 12/2004 |
| KR | 2011-0014033 A | 2/2011 |
| KR | 10-14-5328 B1 | 6/2014 |
| KR | 10-1405328 B1 | 6/2014 |

*Primary Examiner* — Tremesha S Willis
(74) *Attorney, Agent, or Firm* — Lewis Roca Rothgerber Christie LLP

(57) ABSTRACT

A printed circuit board includes: a base substrate having a plurality of pad group areas arranged in a first direction on the base substrate, each of the pad group areas being divided into first, second, and third pad areas that are sequentially arranged in a second direction crossing the first direction; first and second row pads disposed within each of the pad group areas and arranged in a third direction crossing the first and second directions; first lines respectively connected to the first row pads; and lower dummy lines on a same layer as that of the first lines. Some of the first row pads are in the first pad area, rest of the first row pads and some of the second row pads are in the second pad area, and rest of the second row pads are in the third pad area.

25 Claims, 20 Drawing Sheets

PRINTED CIRCUIT BOARD AND DISPLAY APPARATUS INCLUDING THE SAME

CROSS-REFERENCE TO RELATED APPLICATION

This patent application claims priority to and the benefit of Korean Patent Application No. 10-2016-0057177, under 35 U.S.C. § 119, filed on May 10, 2016, in the Korean Intellectual Property Office (KIPO), the entire content of which is hereby incorporated by reference.

BACKGROUND

1. Field

One or more aspects of example embodiments of the present disclosure relate to a printed circuit board and a display apparatus including the same.

2. Description of the Related Art

An electronic device includes at least two electronic components. For example, an electronic device, such as a portable phone, a notebook computer, and/or a television, includes a display panel for generating an image, a main line board, and a flexible printed circuit board.

The two electronic components are electrically connected to each other. The two electronic components are electrically connected to each other through coupling of pad parts. A process of electrically connecting the pad parts of the two electronic components to each other (hereinafter, referred to as a bonding process) includes a process of aligning and coupling the pad parts of the two electronic components. In the coupling of the pad parts, a thermal compression tool may be used.

When the display apparatus has high resolution, the number of pads for transmitting and receiving a signal may increase. When the number of pads increases, a non-display area on each of the display panel and the flexible printed circuit board may increase.

The above information discussed in this Background section is only for enhancement of understanding of the background of the present disclosure, and therefore, it may contain information that does not constitute prior art.

SUMMARY

One or more aspects of example embodiments of the present disclosure provide a display apparatus including a printed circuit board and a display panel, each of which has a reduced area on which pads are disposed.

One or more aspects of example embodiments of the present disclosure also provide a display apparatus including a printed circuit board and a display panel on which more pads are disposed on a limited area.

One or more aspects of example embodiments of the present disclosure also provide a display apparatus that is capable of controlling a flow path of a conductive adhesion material to prevent or substantially prevent a difference in resistance and adhesion force for each area of a flexible printed circuit board from occurring.

One or more aspects of example embodiments of the present disclosure also provide a display apparatus that is capable of solving bonding failures between a flexible printed circuit board and a display panel when being bonded due to dummy lines.

According to an example embodiment of the inventive concept, a printed circuit board includes: a base substrate having two adjacent sides that respectively extend in first and second directions crossing each other, and a plurality of pad group areas arranged in the first direction on the base substrate; first row pads disposed within each of the pad group areas and arranged in a third direction crossing the first and second directions; second row pads disposed within each of the pad group areas, arranged in the third direction, and spaced from the first row pads on a plane; first lines on a same layer as that of the first row pads and respectively connected to the first row pads; and lower dummy lines on the same layer as that of the first lines and spaced from the first and second row pads on the plane. Each of the pad group areas is divided into first, second, and third pad areas that are sequentially arranged in the second direction, and some of the first row pads are in the first pad area, rest of the first row pads and some of the second row pads are in the second pad area, and rest of the second row pads are in the third pad area.

In an example embodiment, the first lines and the lower dummy lines may extend in the second direction within the pad group areas.

In an example embodiment, the lower dummy lines may be configured to be electrically floated.

In an example embodiment, the lower dummy lines may be disposed within the pad group areas on the plane.

In an example embodiment, the printed circuit board may further include a driving circuit chip on the base substrate, and the first lines may be connected between the first row pads and the driving circuit chip.

In an example embodiment, some of the lower dummy lines may be between some of the first row pads and some of the second row pads on the plane, and others of the lower dummy lines may be between the second row pads and a first edge of the pad group areas, the first edge being farther away from the driving circuit chip in the second direction on the plane than other edges of the pad group areas.

In an example embodiment, the printed circuit board may further include: via lands on one surface of the base substrate; and via patterns overlapping with the via lands and passing through the base substrate to be respectively connected to the second row pads. The first row pads, the second row pads, the first lines, and the lower dummy lines may be on another surface of the base substrate opposite to the one surface of the base substrate.

In an example embodiment, the printed circuit board may further include: second upper lines on the one surface of the base substrate and respectively connected to the via lands; second lower lines on the other surface of the base substrate and connected to the driving circuit chip; and second via patterns passing through the base substrate to connect each of the second upper lines to each of the second lower lines.

In an example embodiment, the printed circuit board may further include upper dummy lines on a same layer as that of the second upper lines and spaced from the first and second row pads on the plane.

In an example embodiment, the second upper lines and the upper dummy lines may extend in the second direction within the pad group areas.

In an example embodiment, the upper dummy lines may be configured to be electrically floated.

In an example embodiment, the upper dummy lines may be disposed within the pad group areas on the plane.

In an example embodiment, some of the upper dummy lines may be between some of the first row pads and some of the second row pads on the plane, and others of the upper dummy lines may be between the second row pads and a first edge of the pad group areas, the first edge being farther away from the driving circuit chip in the second direction on the plane than other edges of the pad group areas.

In an example embodiment, at least one of the first row pads may have a width in the first direction that is shorter than that of another one of the first row pads.

In an example embodiment, at least one of the first row pads may have a height in the second direction that is longer than that of another one of the first row pads.

In an example embodiment, at least one of the first row pads may have a width in the first direction that is shorter than that of another one of the first row pads by a first distance, and a length in the second direction that is longer than that of the other one of the first row pads by the first distance.

In an example embodiment, each of the first row pads may be separated from each other in the second direction by a same distance, and some of the second row pads may be separated from each other in the second direction by a distance different than that of others of the second row pads.

According to an example embodiment of the inventive concept, a display apparatus includes: a printed circuit board having two adjacent sides that respectively extend in first and second directions crossing each other, and a plurality of pad group areas arranged in the first direction on the printed circuit board; and a display panel electrically connected to the printed circuit board through the pad group areas. The printed circuit board includes: first row pads disposed within each of the pad group areas and arranged in a third direction crossing the first and second directions; second row pads disposed within each of the pad group areas, arranged in the third direction, and spaced from the first row pads; first lines on a same layer as that of the first row pads and respectively connected to the first row pads; and lower dummy lines on the same layer as that of the first lines and spaced from the first and second row pads on a plane. Each of the pad group areas is divided into first, second, and third pad areas that are sequentially arranged in the second direction, and some of the first row pads are in the first pad area, rest of the first row pads and some of the second row pads are in the second pad area, and rest of the second row pads are in the third pad area.

In an example embodiment, the display panel may include: first row panel pads respectively overlapping with the first row pads on the plane; and second row panel pads respectively overlapping with the second row pads on the plane. Some of the first row panel pads may be on the first pad area, rest of the first row panel pads and some of the second row panel pads may be on the second pad area, and rest of the second row panel pads may be on the third pad area.

In an example embodiment, the lower dummy lines may be disposed within the pad group areas on the plane, and the lower dummy lines may be configured to be electrically floated.

In an example embodiment, the display apparatus may further include a conductive adhesion material between the display panel and the printed circuit board, and the lower dummy lines may be configured to control a flow path of the conductive adhesion material when the display panel is bonded to the printed circuit board via the conductive adhesion material.

According to an example embodiment of the inventive concept, a printed circuit board includes: a base substrate having two adjacent sides that respectively extend in first and second directions crossing each other, and a plurality of pad group areas arranged in the first direction on the base substrate; via lands on one surface of the base substrate; first row pads on another surface of the base substrate opposite to the one surface of the base substrate within each of the pad group areas on a plane, the first row pads being arranged in a third direction crossing the first and second directions; second row pads on the other surface of the base substrate within each of the pad group areas on the plane, arranged in the third direction, and spaced from the first row pads on the plane; via patterns overlapping with the via lands and passing through the base substrate to be respectively connected to the second row pads; second upper lines on a same layer as that of the via lands and respectively connected to the via lands; and upper dummy lines on the same layer as that of the second upper lines and spaced from the first and second row pads on the plane. Each of the pad group areas is divided into first, second, and third pad areas that are sequentially arranged in the second direction, and some of the first row pads are in the first pad area, rest of the first row pads and some of the second row pads are in the second pad area, and rest of the second row pads are in the third pad area.

In an example embodiment, the upper dummy lines may be disposed within the pad group areas on the plane, and the upper dummy lines may be configured to be electrically floated.

In an example embodiment, the second upper lines and the upper dummy lines may extend in the second direction within the pad group areas.

In an example embodiment, the printed circuit board may further include a driving circuit chip on the base substrate, the second upper lines may be connected between the second row pads and the driving circuit chip, some of the upper dummy lines may be between some of the first row pads and some of the second row pads on the plane, and others of the upper dummy lines may be between the second row pads and a first edge of the pad group areas, the first edge being farther away from the driving circuit chip in the second direction on the plane than other edges of the pad group areas.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept, and together with the detailed description, serve to explain aspects and features of the inventive concept. In the drawings.

DETAILED DESCRIPTION

Figure 1:
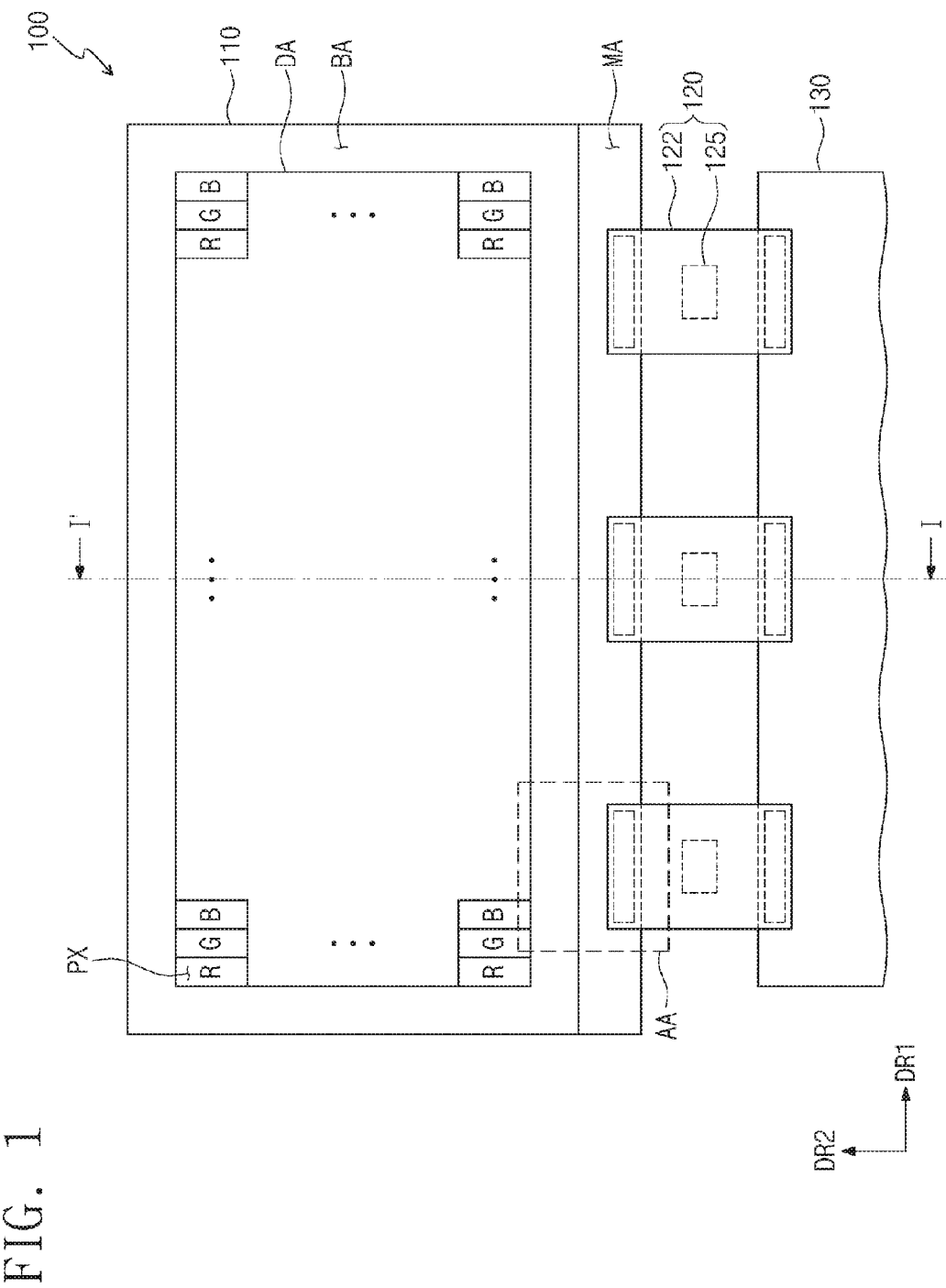
FIG. 1 is a plan view of a display apparatus according to an embodiment of the inventive concept.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
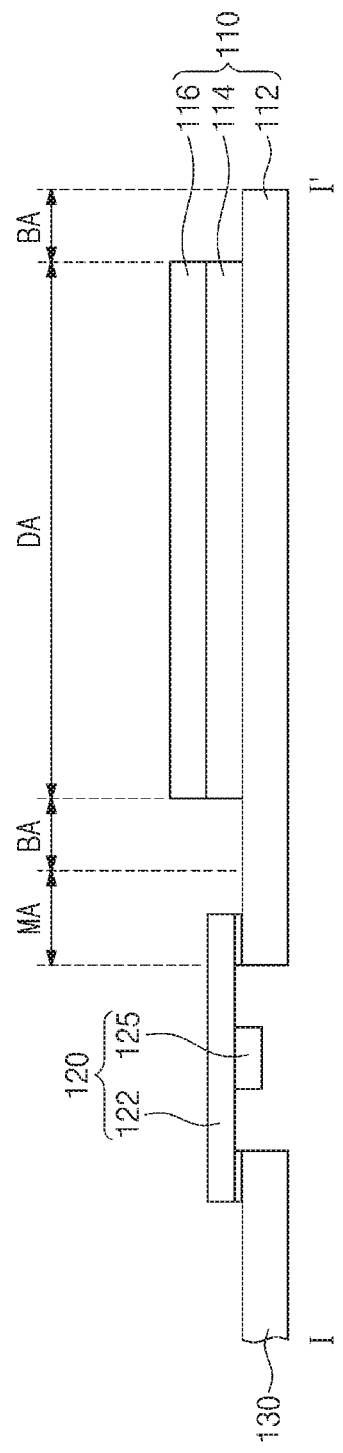
FIG. 2 is a cross-sectional view taken along the line I-I' of FIG. 1.

FIG. 1 is a plan view of a display apparatus according to an embodiment of the inventive concept, and FIG. 2 is a cross-sectional view taken along the line I-I' of FIG. 1.

Referring to FIGS. 1 and 2, a display apparatus 100 according to an embodiment of the inventive concept includes a display panel 110, a flexible printed circuit board (or a plurality of flexible printed circuit boards) 120, and a main driving board 130. The display panel 110, the flexible printed circuit board 120, and the main driving board 130 are electrically connected to each other.

The display panel 110 may display a desired image by applying a driving signal to a plurality of pixels PX. The plurality of pixels PX may be disposed in a matrix form in first and second directions DR1 and DR2, which are perpendicular to each other. In an embodiment of the inventive concept, the pixels PX may include first to third pixels that respectively display a red color R, a green color G, and a blue color B. In an embodiment of the inventive concept, the pixels PX may further include some pixels that respectively display white, cyan, and magenta colors. The plurality of pixels PX may be defined as display units of the display panel 110.

The display panel 110 may be classified as a liquid crystal panel, an organic light emitting display panel, or an electrowetting display panel according to the kinds of the plurality of pixels PX. In the present embodiment, the display panel 110 is described as the organic light emitting display panel for convenience.

The display panel may be divided into a display area DA on which the plurality of pixels PX are disposed, a non-display area BA surrounding the display area DA, and a mounting area MA to which the flexible printed circuit board 120 is coupled. In an embodiment of the inventive concept, the non-display area BA and the mounting area MA may not be divided. For example, the non-display area BA may be omitted, or the mounting area MA may be a portion of the non-display area BA.

As illustrated in FIG. 2, the display panel 110 may include a display substrate 112, a display device layer 114 disposed on the display substrate 112, and an encapsulation layer 116 disposed on the display device layer 114. The display substrate 112 may include a substrate and a plurality of insulation layers, functional layers, and conductive layers that are disposed on the substrate. The conductive layer may include gate lines, data lines, and other signal lines. Also, the conductive layers may include pad parts connected to the lines (e.g., the gate lines, data lines, and/or other signal lines). The lines provide driving signals to the plurality of pixels PX.

The display device layer 114 may include a plurality of insulation layers, functional layers, and conductive layers that form the plurality of pixels PX. The functional layers may include an organic light emitting layer. The encapsulation layer 116 may be disposed on the display device layer 114. The encapsulation layer 116 protects the display device layer 114. In an embodiment of the inventive concept, the encapsulation layer 116 may also cover a side surface of the display device layer 114.

A black matrix that blocks light may be disposed on the non-display area BA. A gate driving circuit for supplying gate signals to the plurality of pixels PX may be disposed on the non-display area BA. In an embodiment of the inventive concept, a data driving circuit may be further disposed on the non-display area BA. A pad part for receiving a signal supplied from the flexible printed circuit board 120 may be disposed on the mounting area MA.

As illustrated in FIGS. 1 and 2, the flexible printed circuit board 120 (or each of the flexible printed circuit boards) includes a flexible line board 122 and a driving circuit chip 125. The driving circuit chip 125 is electrically connected to lines of the flexible line board 122.

The flexible printed circuit board 120 may have two sides that are adjacent to each other and respectively extend in the first and second directions DR1 and DR2 (e.g., see FIG. 1).

When the flexible printed circuit board 120 includes the driving circuit chip 125, the pad part of the display panel 110 may include data pads electrically connected to the data lines and control signal pads electrically connected to control signal lines (e.g., gate lines). The data lines may be connected to the pixels PX, and the control signal lines may be connected to the gate driving circuit. Although the flexible printed circuit board 120 is shown as having a chip on film structure in the present embodiment, the inventive concept is not limited thereto. In another embodiment, for example, the driving circuit chip may be mounted on the non-display area BA of the display panel 110, and the flexible printed circuit board may include the flexible line board.

The main driving board 130 may be electrically connected to the display panel 110 through the flexible line board 122 to transmit/receive a signal to/from the driving circuit chip 125. The main driving board 130 may provide image data, a control signal, and a power voltage to the display panel 110 and/or the flexible printed circuit board 120. The main driving board 130 may include an active device and a passive device. The main driving board 130 may include pad parts connected to the flexible printed circuit board 120.

Figure 3:
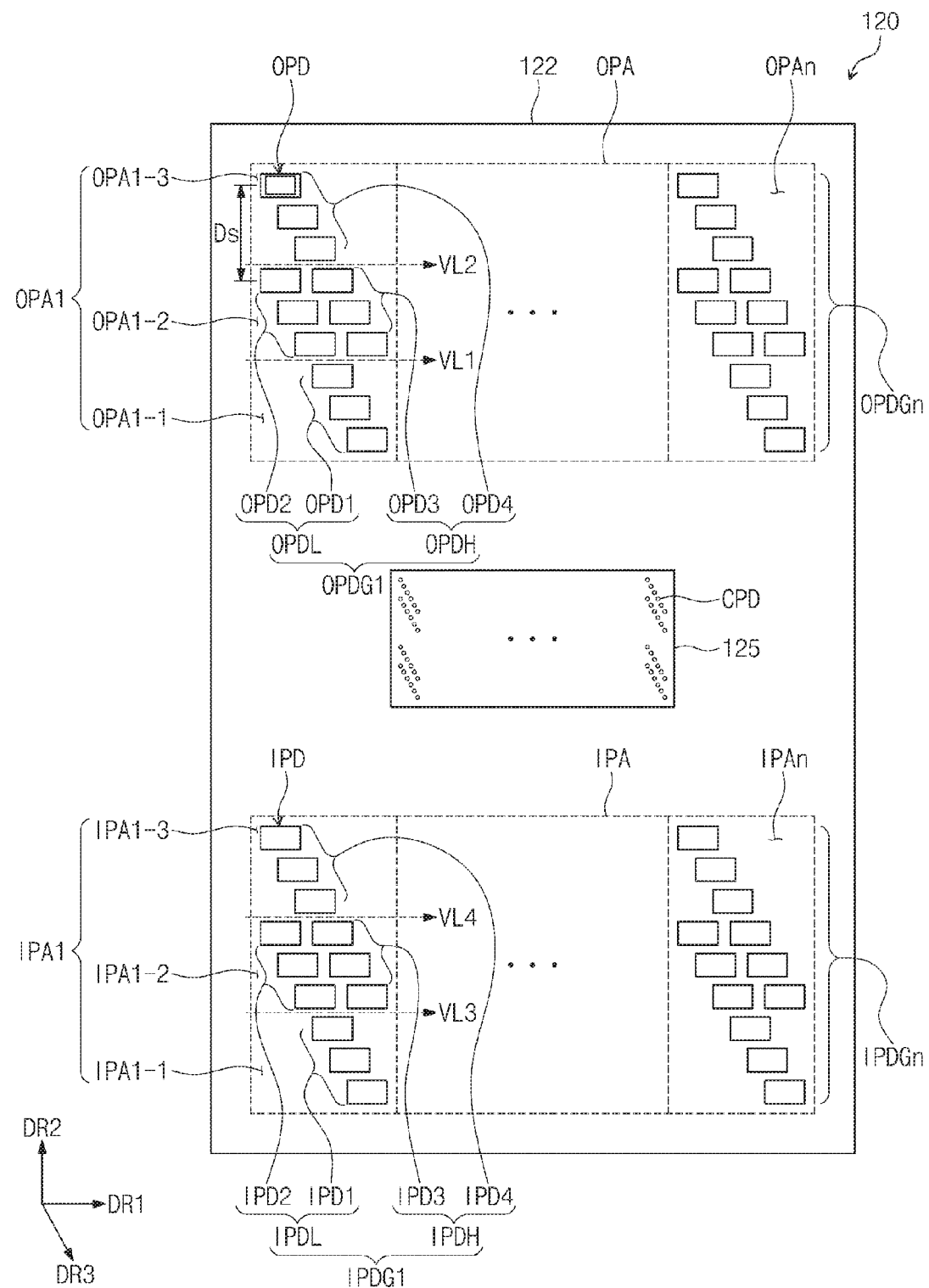
FIG. 3 is a plan view of a flexible printed circuit board according to an embodiment of the inventive concept.

FIG. 3 is a plan view of the flexible printed circuit board according to an embodiment of the inventive concept.

Referring to FIG. 3, the flexible line board 122 may include a plurality of pads OPD, IPD, and CPD, and a plurality of lines.

The plurality of pads OPD, IPD, and CPD may include connection pads CPD connected to connection terminals of the driving circuit chip 125, input pads IPD connected to the main driving board 130, and output pads OPD connected to the display panel 110.

The connection pads CPD may be aligned to overlap both sides (e.g., both ends)_of the driving circuit chip 125 in the second direction DR2. In another embodiment of the inventive concept, unlike those shown in FIG. 3, the connection pads CPD may be variously arranged (e.g., randomly arranged) to correspond to the connection terminals of the driving circuit chip 125.

An input pad area IPA may be defined on one side (e.g., one end) of the flexible line board 122 in the second direction DR2, and an output pad area OPA may be defined on the other side (e.g., opposite end) of the flexible line board 122 in the second direction DR2. The input pad area IPA may be attached to the main driving board 130. The output pad area OPA may be attached to the mounting area MA of the display panel 110.

The input pad area IPA may be divided into a plurality of input pad group areas IPA1 to IPAn. The input pad group areas IPA1 to IPAn may be adjacent to each other, respectively, in the first direction DR1. The input pad group areas IPA1 to IPAn may be divided by virtual lines extending in the second direction DR2.

The output pad area OPA may be divided into a plurality of output pad group areas OPA1 to OPAn. The output pad group areas OPA1 to OPAn may be adjacent to each other, respectively, in the first direction DR1. The output pad group areas OPA1 to OPAn may be divided by virtual lines extending in the second direction DR2.

The input pads IPD may include a plurality of input pad groups IPDG1 to IPDGn. The plurality of input pad groups IPDG1 to IPDGn may be disposed within the plurality of input pad group areas IPA1 to IPAn, respectively. The plurality of input pad groups IPDG1 to IPDGn may have the same or substantially the same pad arrangement structure as each other.

The output pads OPD may include a plurality of output pad groups OPDG1 to OPDGn. The plurality of output pad groups OPDG1 to OPDGn may be disposed within the plurality of output pad group areas OPA1 to OPAn, respectively. The plurality of output pad groups OPDG1 to OPDGn may have the same or substantially the same pad arrangement structure as each other.

Hereinafter, a pad arrangement structure in which one output pad group OPDG1 is disposed within one output pad group area OPA1 will be described as an example.

The output pad group OPDG1 may include first row output pads OPDL and second row output pads OPDH.

The first row output pads OPDL may be arranged in the third direction DR3 that crosses the first and second directions DR1 and DR2. The first to third directions DR1 to DR3 may define one plane. The first direction DR1 may be perpendicular to the second direction DR2, and the third direction DR3 may extend at an angle of about 45 degrees with respect to each of the first and second directions DR1 and DR2.

The first row output pads OPDL may be spaced by a distance (e.g., a predetermined distance) from each other in the third direction DR3. Each of the first row output pads OPDL may have a quadrilateral shape (e.g., a rectangular shape) having two adjacent sides that respectively extend in the first and second directions DR1 and DR2. Although six first row output pads OPDL are illustrated as an example, the inventive concept is not limited thereto.

The second row output pads OPDH may be arranged in the third direction DR3. The second row output pads OPDH may be arranged parallel to the first row output pads OPDL. However, the inventive concept is not limited thereto. For example, the first row output pads OPDL and the second row output pads OPDH may extend in different directions from each other.

The second row output pads OPDH may be spaced by a distance (e.g., a predetermined distance) from each other in the third direction DR3. Each of the second row output pads OPDH may have a quadrilateral shape (e.g., a rectangular shape) having two adjacent sides that respectively extend in the first and second directions DR1 and DR2. The second row output pads OPDH may have the same number as that of the first row output pads OPDL. Although six second row output pads OPDH are illustrated as an example, the inventive concept is not limited thereto.

The output pad group areas OPA1 may be divided into first to third output pad areas OPA1-1, OPA1-2, and OPA1-3. The first to third output pad areas OPA1-1, OPA1-2, and OPA1-3 may be successively disposed in the second direction DR2. The first to third output pad areas OPA1-1, OPA1-2, and OPA1-3 may extend in the first direction DR1, and may be divided by two virtual lines VL1 and VL2 spaced apart from each other.

Some pads (e.g., first output pads) OPD1 of the first row output pads OPDL may be disposed on the first output pad area OPA1-1. Other pads (e.g., second output pads) OPD2 of the first row output pads OPDL may be disposed on the second output pad area OPA1-2. Some pads (e.g., third output pads) OPD3 of the second row output pads OPDH may be disposed on the second output pad areas OPA1-2. Other pads (e.g., fourth output pads) OPD4 of the second row output pads OPDH may be disposed on the third output pad area OPA1-3.

The first row output pads OPDL may be arranged in a stair shape within one output pad group area OPA1, and the second row output pads OPDH may be arranged in a stair shape within one output pad group area OPA1 on the plane.

The first and second row output pads OPDL and OPDH, which correspond to each other, may have the same or substantially the same shape within one output pad group area OPA1. For example, one first row output pad OPDL and one second row output pad OPDH, which are spaced apart from each other in the second direction DR2 and disposed at a same position, may have the same shape.

The first and second row output pads OPDL and OPDH may be disposed at the same position in the first direction DR1 within one output pad group area OPA1. Each of the second row output pads OPDH may be disposed at a position corresponding to (e.g., that is spaced by) a distance (e.g., a predetermined distance) Ds from the first row output pads OPDL in the second direction DR2, respectively.

Each of the input pads IPD may have a structure that is the same as or similar to that of each of the output pads OPD. Hereinafter, the pad arrangement structure in which one input pad group IPDG1 is disposed within one input pad group area IPA1 will be described as an example.

The input pad group IPDG1 may include first row input pads IPDL and second row input pads IPDH. The input pad group area IPA1 may be divided into first to third input pad areas IPA1-1, IPA1-2, and IPA1-3. The first to third input pad areas IPA1-1, IPA1-2, and IPA1-3 may be sequentially arranged in the second direction DR2. The first to third input pad areas IPA1-1, IPA1-2, and IPA1-3 may extend in the first direction DR1, and may be divided by two virtual lines VL3 and VL4 spaced apart from each other.

Some pads (e.g., first input pads) IPD1 of the first row input pads IPDL may be disposed on the first input pad area IPA1-1. Other pads (e.g., second input pads) IPD2 of the first row input pads IPDL may be disposed on the second input pad area IPA1-2. Some pads (e.g., third input pads) IPD3 of the second row input pads IPDH may be disposed on the second input pad area IPA1-2. Other pads (e.g., fourth input pads) IPD4 of the second row input pads IPDH may be disposed on the third input pad area IPA1-3.

According to an embodiment of the inventive concept, more pads may be disposed within the limited area of the flexible printed circuit board 120 according to the arranged shape of the input and output pads IPD and OPD.

Some of the lines may connect the connection pads CPD to the input pads IPD, and the other lines may connect the connection pads CPD to the output pads OPD. In some embodiments, the lines may directly connect a portion of the input pads IPD to a portion of the output pads OPD. Detailed description thereof will be provided later.

Figure 4:
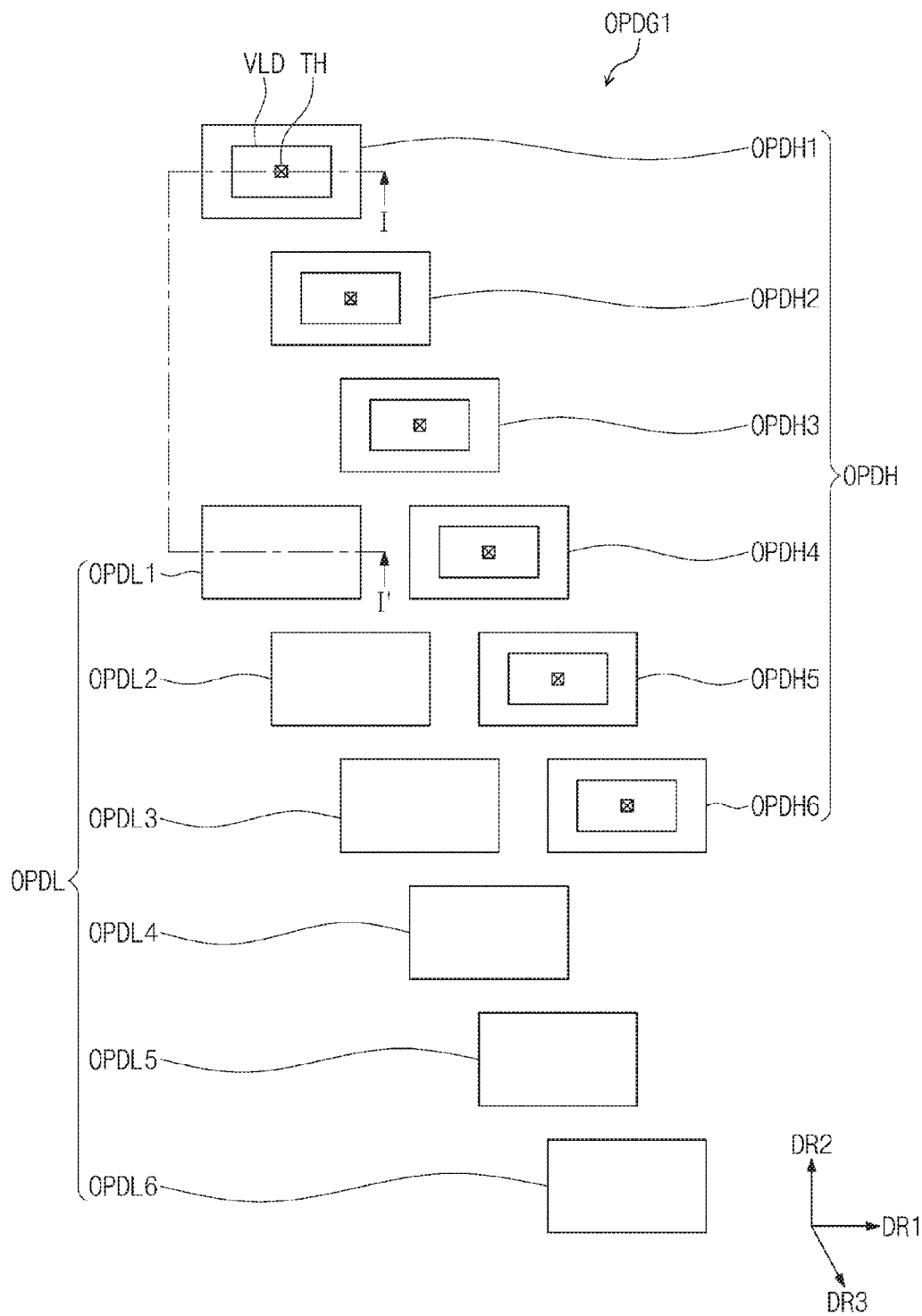
FIG. 4 is an enlarged plan view of one output pad group of FIG. 3.
Figure 5:
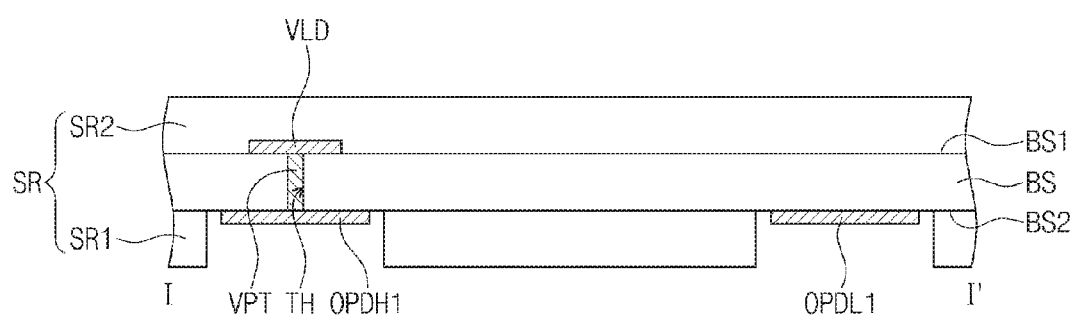
FIG. 5 is a cross-sectional view taken along the line I-I' of FIG. 4.

FIG. 4 is an enlarged plan view of one output pad group OPDG1 of FIG. 3, and FIG. 5 is a cross-sectional view taken along the line I-I' of FIG. 4.

One first row output pad OPDL1 and one second row output pad OPDH1 are illustrated in FIG. 5. The first row output pads OPDL may have the same or substantially the same structure as that of the one first row output pad OPDL1, and the second row output pads OPDH may have the same or substantially the same structure as that of the one second row output pad OPDH1. Hereinafter, a structure of each of the first and second row output pads OPDL1 and OPDH1 will be described as an example.

Referring to FIGS. 4 and 5, the flexible line board 122 may further include a base substrate BS, via lands VLD, via patterns VPT, and a solder resistor SR.

The base substrate BS may be formed of a flexible material (e.g., polyimide).

The plurality of pads OPD, IPD, and CPD and the plurality of lines may be disposed on the base substrate BS. The base substrate BS may have one surface BS1 and another surface (e.g., opposite surface) BS2, which are opposite to each other (e.g., facing in opposite directions). The input pads IPD, output pads OPD, and connection pads CPD may be disposed on the other surface BS2 of the base substrate BS. In an embodiment of the inventive concept, the input pads IPD, the output pads OPD, and the connection pads CPD may be disposed on the same layer.

The via lands VLD may be disposed on the one surface BS1 of the base substrate BS. The via lands VLD may overlap with the second row output pads OPDH, respectively. In an embodiment of the inventive concept, the second row output pads OPDH may cover the corresponding via lands VLD on the plane, respectively. Each of the second row output pads OPDH may have an area greater than that of each of the corresponding via lands VLD.

Through holes TH may be defined in the base substrate BS. Each of the through holes TH may overlap with one second row output pad OPDH1 and one via land VLD, which correspond to each other.

The via patterns VPT may be disposed in the through holes TH. Each of the via patterns VPT may pass through the base substrate BS to contact one of the second row output pads OPDH and one of the via lands VLD, which overlap with each other. Each of the via patterns VPT may be formed of a conductive material and may connect one of the second row output pads OPDH and one of the via lands VLD to each other, which overlap with each other.

The solder resistor SR may include a first solder resistor SR1 and a second solder resistor SR2.

The first solder resistor SR1 may be disposed on the other surface BS2 of the base substrate BS. The first solder resistor SR1 may cover lines disposed on the other surface BS2 of the base substrate BS. Openings through which the input pads IPD and the output pads OPD are exposed may be defined in the first solder resistor SR1.

The second solder resistor SR2 may be disposed on the one surface BS1 of the base substrate BS. The second solder resistor SR2 may cover the lines disposed on the one surface BS1 of the base substrate BS.

The lines may include input lines, output lines, and dummy lines. The input lines may connect the input pads IPD to the driving circuit chip 125. The output lines may connect the output pads IPD to the driving circuit chip 125. Because each of the input lines has a structure that is the same or substantially similar to that of each of the output lines, the structure of each of the output lines will be described as an example.

The output lines may include first output lines and second output lines. The second output lines may include second upper output lines, second lower output lines, and second via patterns.

The dummy lines may include lower dummy lines and upper dummy lines.

Hereinafter, the first output lines, the second lower output lines, and the lower dummy lines will be described with reference to FIGS. 6 and 7, and the second output lines and the upper dummy lines will be described with reference to FIGS. 6 to 9.

Figure 6:
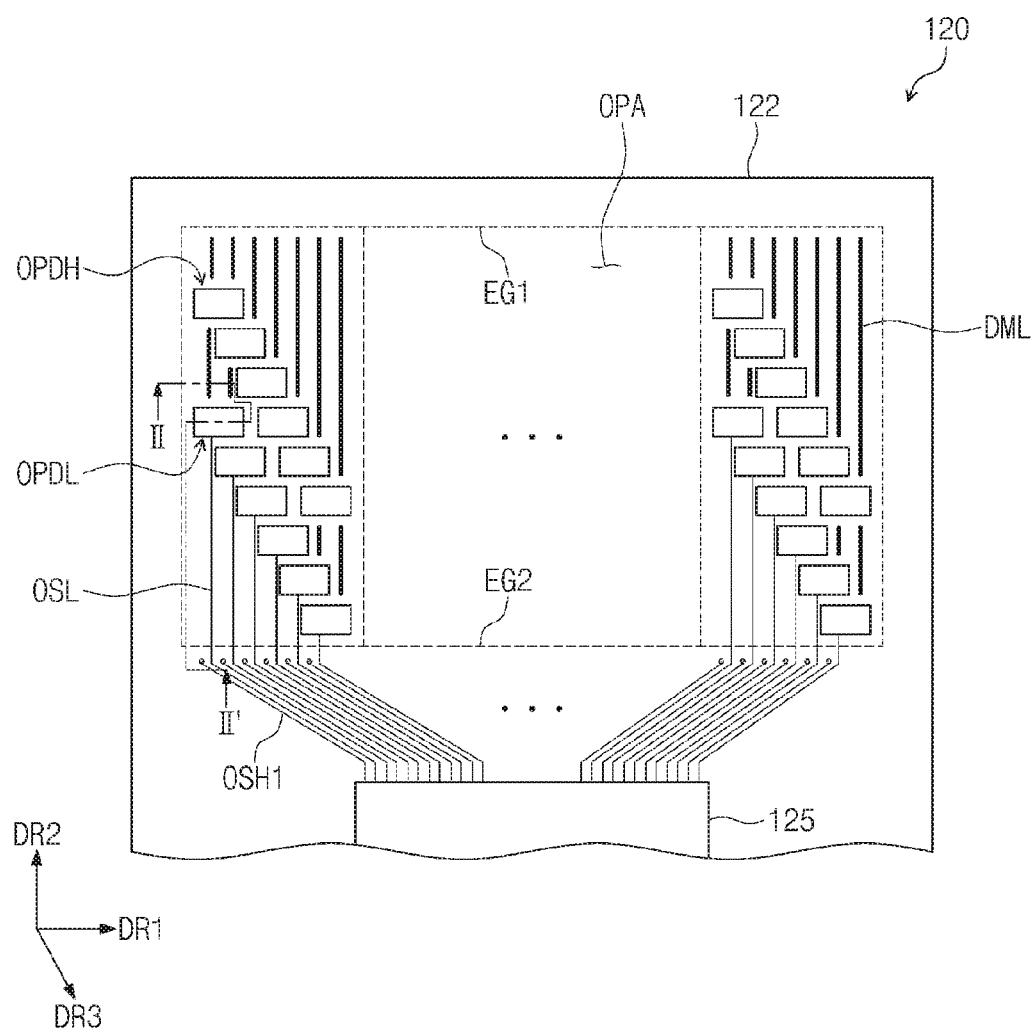
FIG. 6 is a partial plan view of the flexible printed circuit board on which first output lines, second lower output lines, and lower dummy lines are illustrated.
Figure 7:
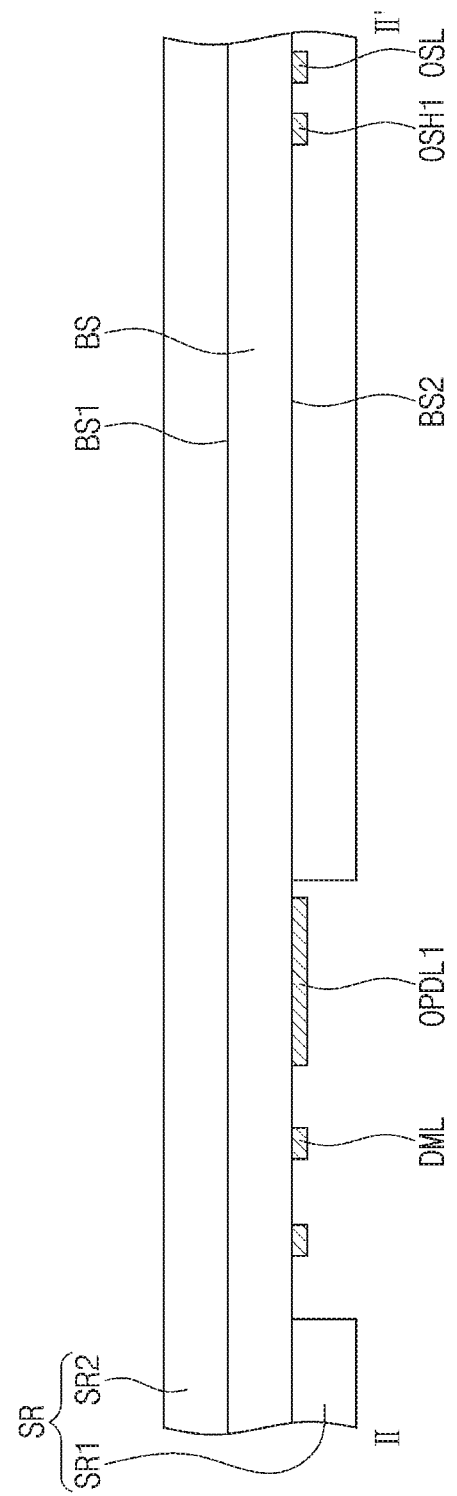
FIG. 7 is a cross-sectional view taken along the line II-II' of FIG. 6.

FIG. 6 is a partial plan view of the flexible printed circuit board on which the first output lines, the second lower output lines, and the lower dummy lines are illustrated, and FIG. 7 is a cross-sectional view taken along the line II-II' of FIG. 6.

Referring to FIGS. 6 and 7, the first output lines OSL may connect each of the first row output pads OPDL to the driving circuit chip 125. The first output lines OSL may be disposed on the other surface BS2 of the base substrate BS. The first output lines OSL may be disposed on the same layer as that of the first row output pads OPDL. The first output lines OSL may extend in the second direction DR2 within the output pad area OPA.

Each of the second lower output lines OSH1 may be connected to the driving circuit chip. The second lower output lines OSH1 may be disposed on the other surface BS2 of the base substrate BS. The second lower output lines OSH1 may be spaced apart from the first output lines OSL, and may be disposed on the same layer as that of the first output lines OSL.

Each of the lower dummy lines DML may be disposed within the output pad area OPA. Although not shown, each of the lower dummy lines DML may be disposed within the input pad area (e.g., see IPA of FIG. 3). In FIG. 6, each of the lower dummy lines DML is illustrated as a line having a thickness greater than that of each of the first output lines OSL and second lower output lines OSH1.

Some lower dummy lines DML of the lower dummy lines DML may be disposed between a portion of the first row output pads OPDL and a portion of the second row output pads OPDH on the plane. Also, other lower dummy lines DML of the lower dummy lines DML may be disposed between the second row output pads OPDH and a first edge EG1 of the output pad area OPA, which is spaced farther away from the driving circuit chip 125 in the second direction DR2 from among the edges of the output pad area OPA.

The lower dummy lines DML may be spaced apart from the first row output pads OPDL and the second row output pads OPDH. The lower dummy lines DML may be spaced apart from each other.

The lower dummy lines DML may extend in the second direction DR2.

The lower dummy lines DML may be electrically floated.

The lower dummy lines DML may be disposed on the other surface BS2 of the base substrate BS. The lower dummy lines DML may be disposed on the same layer as that of the first output lines OSL and the second lower output lines OSH1.

The first solder resistor SR1 may expose the lower dummy lines DML.

Figure 8:
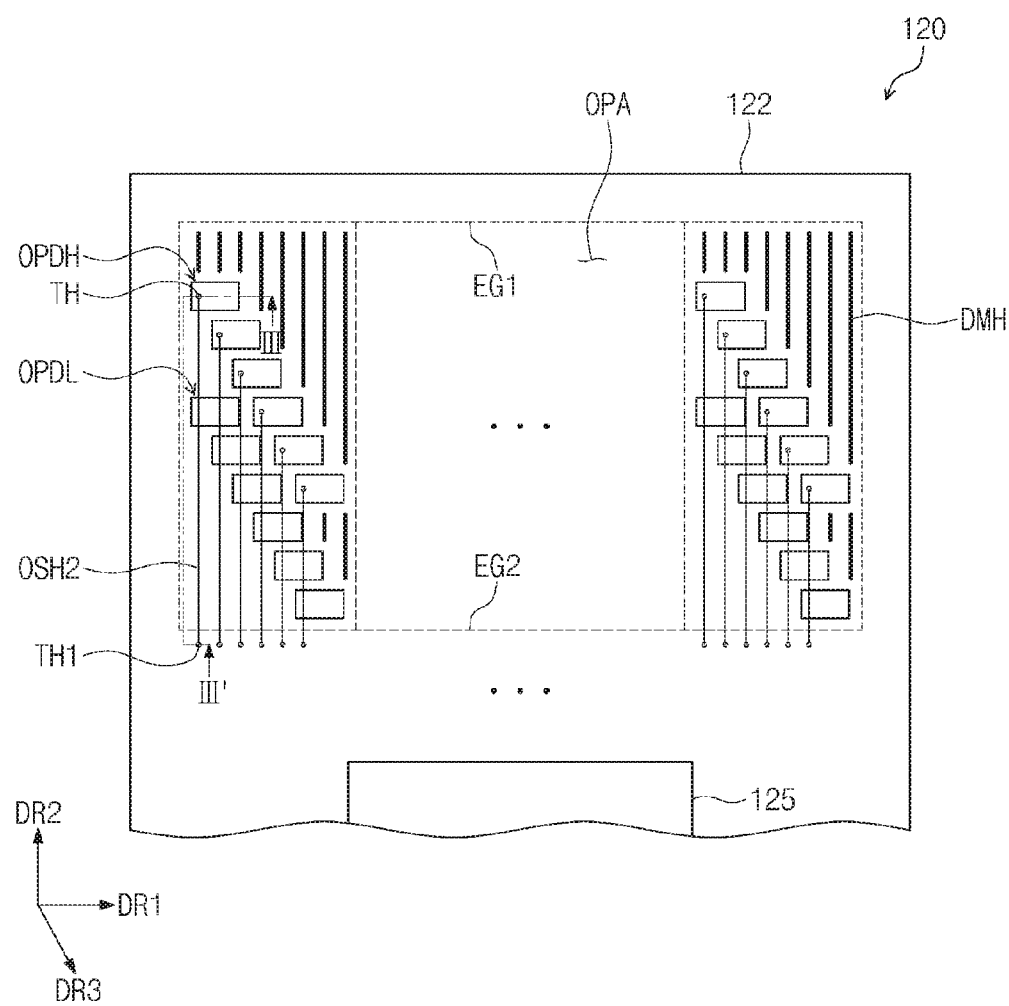
FIG. 8 is a partial plan view of the flexible printed circuit board on which second upper output lines and upper dummy lines are illustrated.
Figure 9:
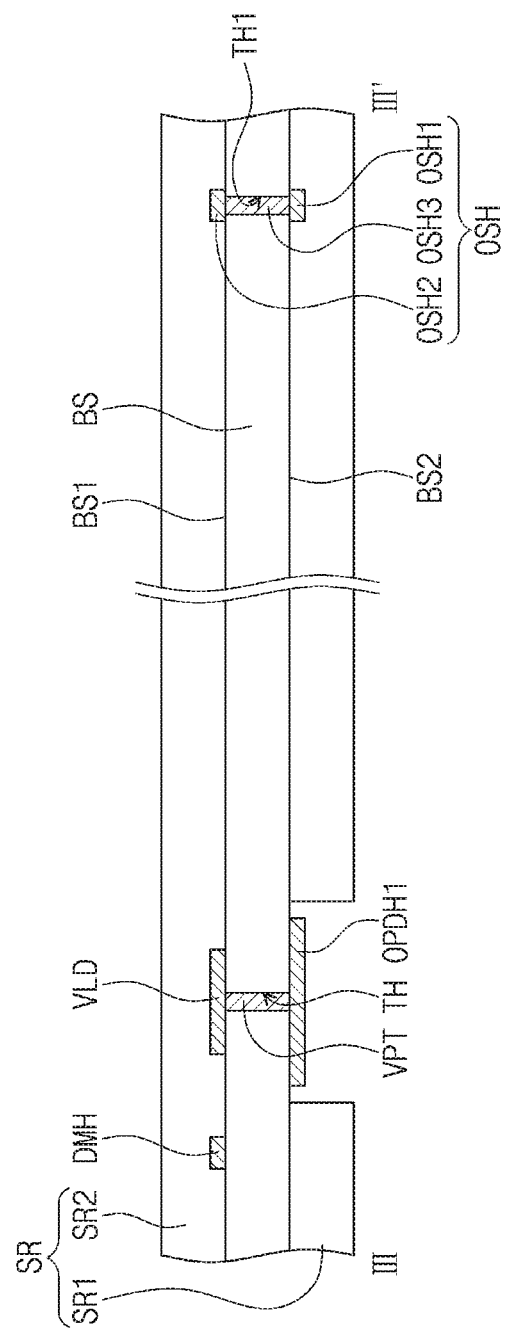
FIG. 9 is a cross-sectional view taken along the line III-III' of FIG. 8.

FIG. 8 is a partial plan view of the flexible printed circuit board on which the second upper output lines and the upper dummy lines are illustrated, and FIG. 9 is a cross-sectional view taken along the line III-III' of FIG. 8.

Referring to FIGS. 8 and 9, the second upper output lines OSH2 may be connected to the via lands VLD, respectively. The second upper output lines OSH2 may be disposed on the one surface BS1 of the base substrate BS. The second upper output lines OSH2 may be disposed on the same layer as that of the via lands VLD. The second upper output lines OSH2 may extend in the second direction DR2 within the output pad area OPA.

Each of the second via patterns OSH3 may be disposed in each of second via through holes TH1 passing through the base substrate BS. The second via patterns OSH3 may connect the second lower output lines OSH1 to the second upper output lines OSH2. Each of the second via patterns OSH3 may be disposed to overlap with each of the second lower output lines OSH1 and each of the second upper output lines OSH2.

The second row output pads OPDH may be electrically connected to the driving circuit chip 125 through the via lands VLD, the via patterns VPT, the second upper output lines OSH2, the second via patterns OSH3, and the second lower output lines OSH1.

The upper dummy lines DMH may be disposed within the output pad area OPA. Although not shown, each of the upper dummy lines DMH may be disposed within the input pad area (e.g., see IPA of FIG. 3). In FIG. 8, each of the upper dummy lines DMH is illustrated as a line having a thickness greater than that of each of the second upper output lines OSH2.

Some upper dummy lines DMH of the upper dummy lines DMH may be disposed between a portion of the first row output pads OPDL and a portion of the second row output pads OPDH on the plane. Also, other upper dummy lines DMH of the upper dummy lines DMH may be disposed between the second row output pads OPDH and the first edge EG1 of the output pad area OPA, which is spaced farther away from the driving circuit chip 125 in the second direction DR2 on the plane from among the edges of the output pad area OPA.

The upper dummy lines DMH may be spaced apart from the first row output pads OPDL and the second row output pads OPDH. The upper dummy lines DMH may be spaced apart from each other.

The upper dummy lines DMH may extend in the second direction DR2.

The upper dummy lines DMH may be electrically floated.

The upper dummy lines DMH may be disposed on the one surface BS1 of the base substrate BS. The upper dummy lines DMH may be disposed on the same layer as that of the second upper output lines OSH2 and the via lands VLD.

The second solder resistor SR2 may cover the upper dummy lines DMH.

The output pads OPDL and OPDH disposed within the output pad area OPA may be bonded to panel pads PPDL and PPDH of the display panel 110, which will be described later, by a conductive adhesion material (e.g., see conductive adhesion material 140 of FIG. 12). In the display apparatus 100 according to an embodiment of the inventive concept, when the bonding process is performed, the conductive adhesion material (e.g., see conductive adhesion material 140 of FIG. 12) may be moved to the second edge EG2 of the output pad area OPA in the second direction DR2 between the first output lines OSL. Also, when the bonding process is performed, the conductive adhesion material may be moved to the first edge EG1 of the output pad area OPA in the second direction DR2 between the lower dummy lines DML. For example, the first output lines OSL and the lower dummy lines DML may guide a flow path of the conductive adhesion material (e.g., see conductive adhesion material 140 of FIG. 12). In the display apparatus 100 according to one or more embodiments of the inventive concept, the flow path of the conductive adhesion material may be controlled to prevent or substantially prevent a difference in resistance and adhesion force for each area of the flexible printed circuit board from occurring. Thus, the display apparatus 100 may be secured in reliability.

The first output lines OSL are disposed between the first row output pads OPDL and the second edge EG2 of the output pad area OPA. An area between the first row output pads OPDL and the second edge EG2 of the output pad area OPA may be defined as a first area, and an area between the first row output pads OPDL and the first edge EG1 of the output pad area OPA may be defined as a second area. If the lower dummy lines DML are not provided, when the bonding process is performed, a load applied to the first area may be greater than that applied to the second area. Bonding failures depending on the positions within the output pad area OPA may occur due to the imbalance in load applied to the first and second areas.

In the display apparatus 100 according an embodiment of the inventive concept, when the bonding process is performed, the imbalance in load applied to the first and second areas may be reduced or prevented by the lower dummy lines DML. Thus, the bonding failure between the flexible printed circuit board 120 and the display panel 110 may be reduced or prevented.

The second upper output lines OSH2 are disposed between the second row output pads OPDH and the second edge EG2 of the output pad area OPA. An area between the second row output pads OPDH and the second edge EG2 of the output pad area OPA may be defined as a third area, and an area between the second row output pads OPDH and the first edge EG1 of the output pad area OPA may be defined as a fourth area. If the upper dummy lines DMH are not provided, when the bonding process is performed, a load applied to the third area may be greater than that applied to the fourth area. Bonding failures depending on the positions within the output pad area OPA may occur due to the imbalance in load applied to the third and fourth areas.

In the display apparatus 100 according an embodiment of the inventive concept, when the bonding process is performed, the imbalance in load applied to the third and fourth areas may be reduced or prevented by the upper dummy lines DMH. Thus, the bonding failure between the flexible printed circuit board 120 and the display panel 110 may be reduced or prevented.

Figure 10:
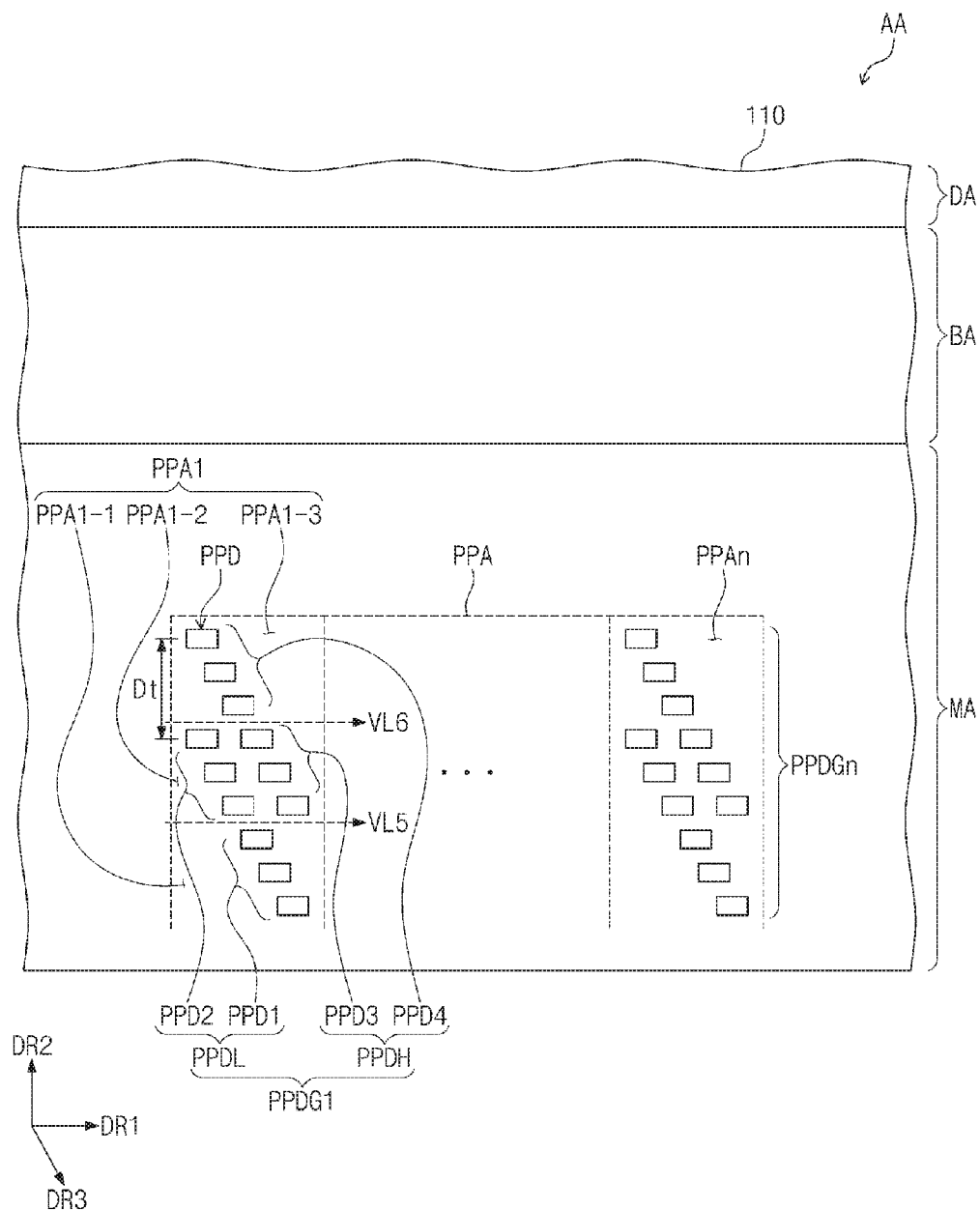
FIG. 10 is a plan view of panel pads disposed on the display panel corresponding to an area AA of FIG. 1.

FIG. 10 is a plan view of panel pads disposed on the display panel corresponding to an area AA of FIG. 1.

Referring to FIGS. 3 and 10, the display panel 110 may include panel pads PPD electrically connected to the output pads OPD of the flexible printed circuit board 120. Each of the panel pads PPD may be a data pad or a control signal pad.

A panel pad area PPA may be defined on the mounting area MA. In a state in which the display panel 110 and the flexible printed circuit board 120 are coupled to each other, the panel pad area PPA and the output pad area OPA may overlap with each other.

The panel pad area PPA may be divided into a plurality of panel pad group areas PPA1 to PPAn. The panel pad group areas PPA1 to PPAn may be adjacent to each other, respectively, in the first direction DR1. The panel pad group areas PPA1 to PPAn may be divided by virtual lines extending in the second direction DR2.

The panel pads PPD may include a plurality of panel pad groups PPDG1 to PPDGn. The plurality of panel pad groups PPDG1 to PPDGn may be disposed within the plurality of panel pad group areas PPA1 to PPAn, respectively. The plurality of panel pad groups PPDG1 to PPDGn may have the same or substantially the same pad arrangement structure as each other.

Hereinafter, a pad arrangement structure of one panel pad group PPDG1 disposed within one panel pad group area PPA1 will be described as an example.

The panel pad group PPDG1 may include first row panel pads PPDL and second row panel pads PPDH.

The first row panel pads PPDL may be arranged in the third direction DR3. The first row panel pads PPDL may be spaced by a distance (e.g., a predetermined distance) from each other in the third direction DR3. Each of the first row panel pads PPDL may have a quadrilateral shape (e.g., a rectangular shape) having two adjacent sides that respectively extend in the first and second directions DR1 and DR2. The first row panel pads PPDL may have the same number as that of the first row output pads OPDL of the flexible printed circuit board 120.

The second row panel pads PPDH may be arranged in the third direction DR3. The second row panel pads PPDH may be arranged parallel to the first row panel pads PPDL. However, the inventive concept is not limited thereto. For example, the first row panel pads PPDL and the second row panel pads PPDH may extend in different directions from each other according to a design. The second row panel pads PPDH may be spaced by a distance (e.g., a predetermined distance) from each other in the third direction DR3. Each of the second row panel pads PPDH may have a quadrilateral shape (e.g., a rectangular shape) having two adjacent sides that respectively extend in the first and second directions DR1 and DR2. The second row panel pads PPDH may have the same number as that of the first row panel pads PPDL.

The second row panel pads PPDH may be closer (e.g., more adjacent) to the display area DA than the first row panel pads PPDL in the second direction DR2.

The panel pad group areas PPA1 may be divided into first to third panel pad areas PPA1-1, PPA1-2, and PPA1-3. The first to third panel pad areas PPA1-1, PPA1-2, and PPA1-3 may be sequentially disposed in the second direction DR2. The first to third panel pad areas PPA1-1, PPA1-2, and PPA1-3 may extend in the first direction DR1, and may be divided by two virtual lines VL5 and VL6 spaced apart from each other.

Some pads (e.g., first panel pads) PPD1 of the first row panel pads PPDL may be disposed on the first panel pad area PPA1-1. Other pads (e.g., second panel pads) PPD2 of the first row panel pads PPDL may be disposed on the second panel pad area PPA1-2. Some pads (e.g., third panel pads) PPD3 of the second row panel pads PPDH may be disposed on the second panel pad area PPA1-2. Other pads (e.g., fourth panel pads) PPD4 of the second row panel pads PPDH may be disposed on the third panel pad area PPA1-3.

The first row panel pads PPDL may be arranged in a stair shape within one panel pad group area PPA1, and the second row panel pads PPDH may be arranged in a stair shape within one panel group area PPA1 on the plane.

The first and second row panel pads PPDL and PPDH, which correspond to each other, may have the same or substantially the same shape within one panel pad group area PPA1. For example, one first row panel pad PPDL and one second row panel pad PPDH, which are spaced apart from each other in the second direction DR2 and disposed at a same position, may have the same or substantially the same shape.

The first and second row panel pads PPDL and PPDH may be disposed at the same position in the first direction DR1 within one panel pad group area PPA1. Each of the second row panel pads PPDH may be disposed at a position corresponding to (e.g., that is spaced by) a distance (e.g., predetermined distance) Dt from the first row panel pads PPDL in the second direction DR2, respectively.

According to an embodiment of the inventive concept, more pads may be disposed within the limited area of the display panel 110 according to the arranged shape of the panel pads PPD. Thus, the mounting area MA of the display panel 110 may be reduced.

Figure 11:
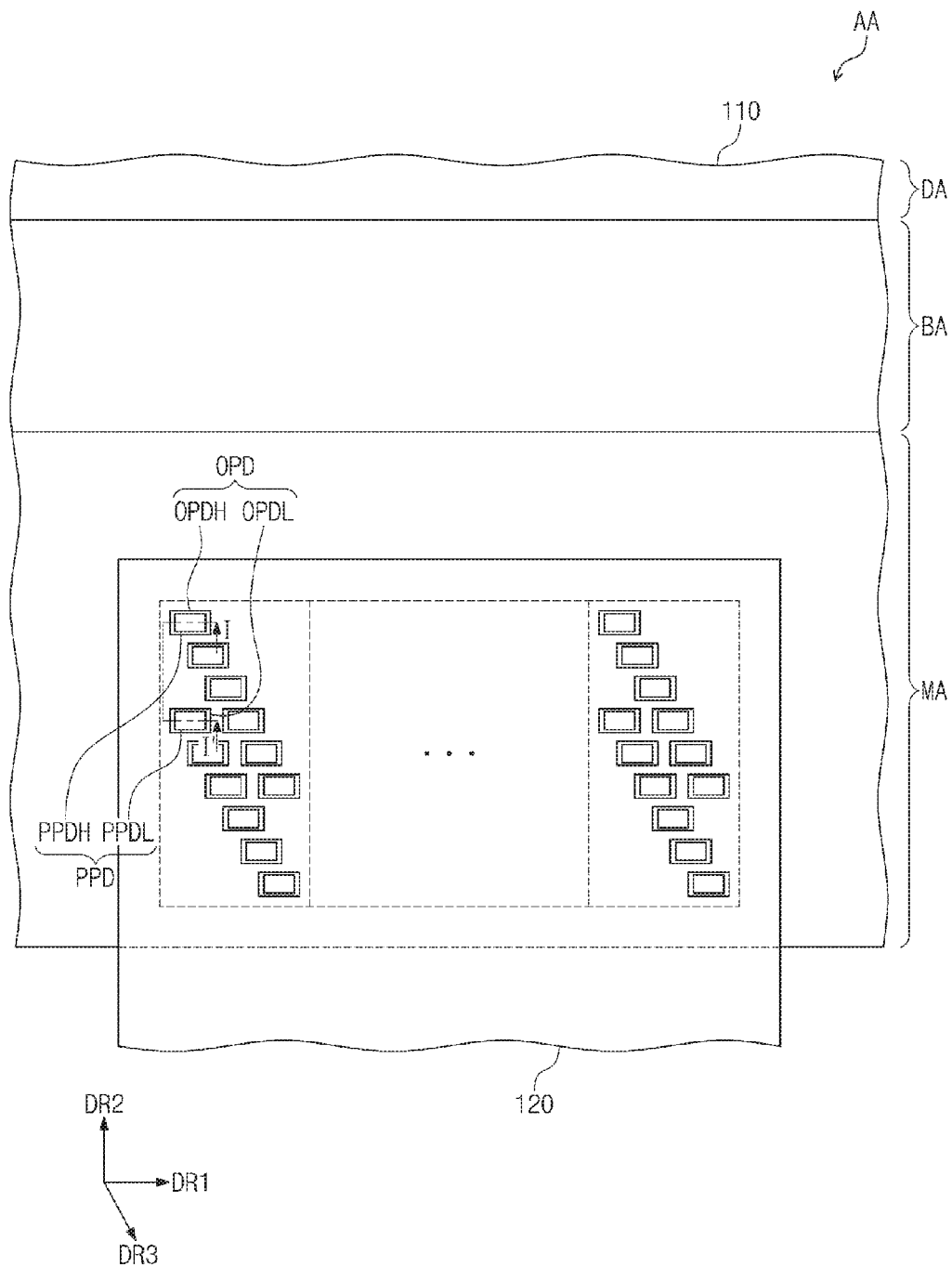
FIG. 11 is an enlarged plan view of the area AA of FIG. 1 in a state in which the display panel and the flexible printed circuit board are coupled to each other.
Figure 12:
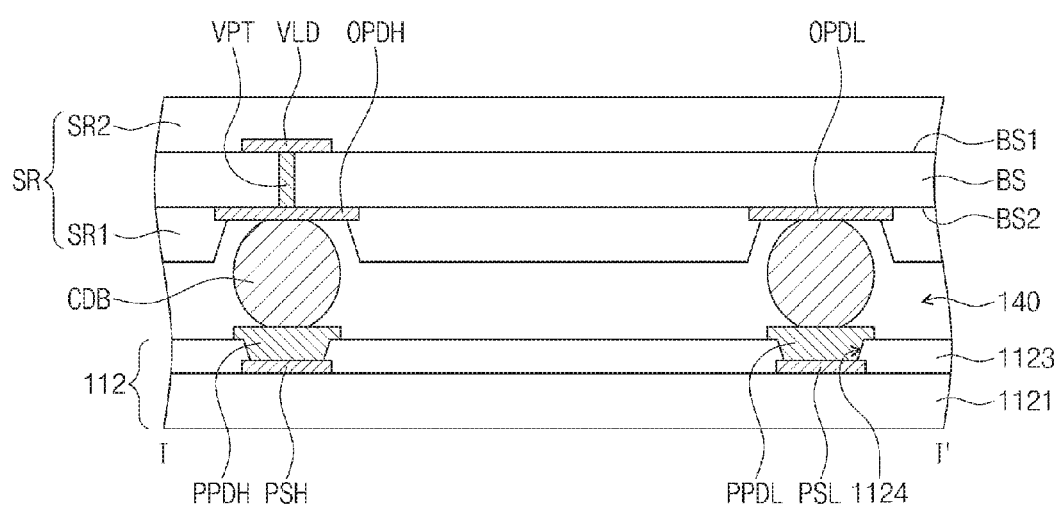
FIG. 12 is a cross-sectional view taken along the line I-I' of FIG. 11.
Figure 13:
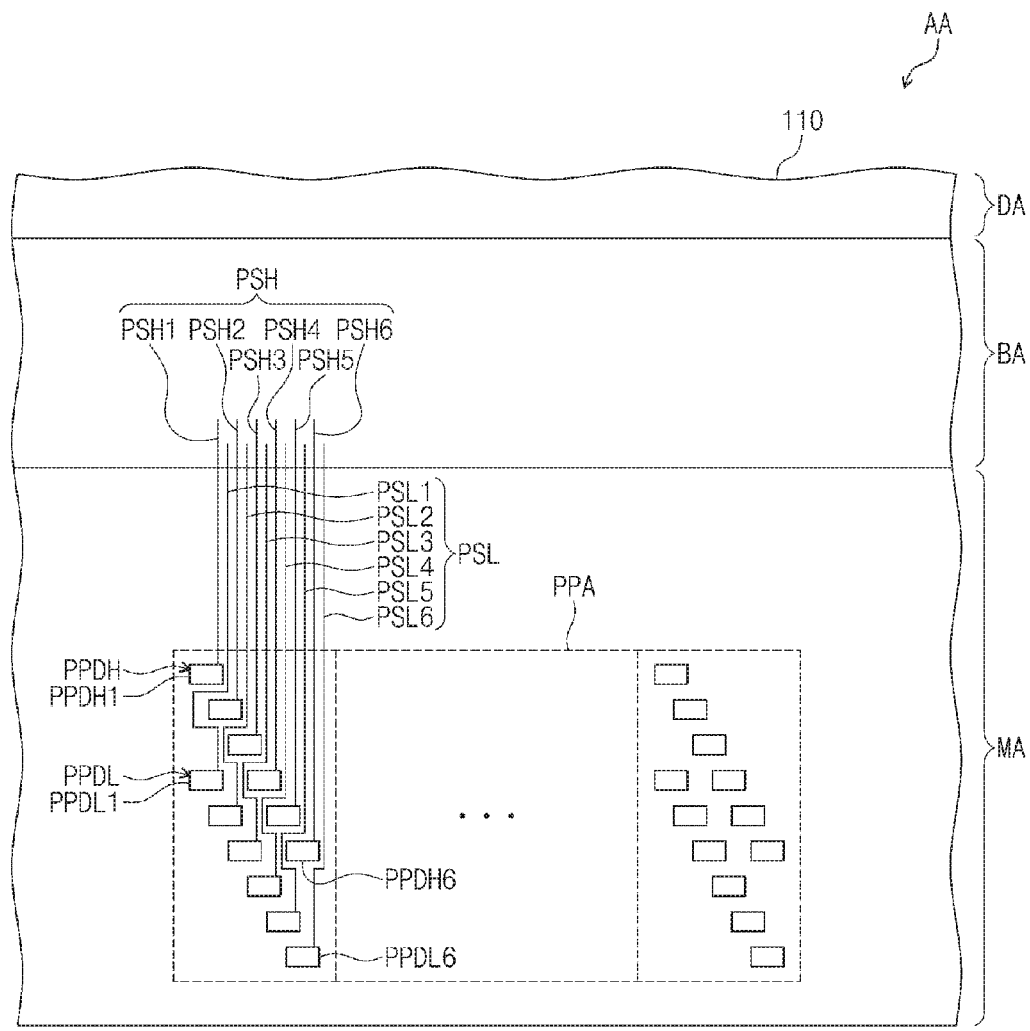
FIG. 13 is a plan view of the panel pads and panel lines, which are disposed on the display panel corresponding to the area AA of FIG. 1.

FIG. 11 is an enlarged plan view of the area AA of FIG. 1 in the state in which the display panel is coupled to the flexible printed circuit board, FIG. 12 is a cross-sectional view taken along the line I-I' of FIG. 11, and FIG. 13 is a plan view of the panel pads and the panel lines, which are disposed on the display panel corresponding to the area AA of FIG. 1.

Referring to FIGS. 11 to 13, each of the output pads OPD may have an area greater than that of each of the panel pads PPD. The output pads OPD may cover the panel pads PPD on the plane, respectively. However, the inventive concept is not limited thereto. For example, when the display panel 110 and the flexible printed circuit board 120 are bonded to each other, some of the output pads OPD may partially not overlap with corresponding ones of the panel pads PPD due to a process error.

The display substrate 112 of the display panel 110 may include a substrate 1121 and panel lines PSL and PSH disposed on the substrate 1121. The panel lines PSL and PSH may be gate lines, data lines, and/or other signal lines. The panel lines PSL and PSH may include first row panel lines PSL connected to the first row panel pads PPDL, and second row panel lines PSH connected to the second row panel pads PPDH. Detailed descriptions thereof will be described later.

The panel lines PSL and PSH may be disposed on an insulation layer 1123. The insulation layer 1123 may include a barrier layer and passivation layers. The panel pads PPD may be disposed on the insulation layer 1123, and may be connected to the panel lines PSL and PSH through through-holes 1124 defined in the insulation layer 1123. The first row panel pads PPDL may be connected to the first row panel lines PSL, and the second row panel pads PPDH may be connected to the second row panel lines PSH.

The display apparatus 100 may further include a conductive adhesion material 140 disposed between the display panel 110 and the flexible printed circuit board 120. The output pads OPDH and OPDL may be electrically connected to the panel pads PPDH and PPDL through the conductive adhesion material 140. The first row panel pads PPDL may be electrically connected to the first row output pads OPDL through a plurality of conductive balls CDB of the conductive adhesion material 140, respectively. Also, the second row panel pads PPDH may be electrically connected to the second output pads OPDH through the plurality of conductive balls CDB of the conductive adhesion material 140, respectively.

In the display apparatus 100 according to one or more embodiments of the inventive concept, the imbalance in load for each area of the flexible printed circuit board 120 may be reduced or prevented by the dummy lines. Thus, the bonding failure between the flexible printed circuit board 120 and the display panel 110 may be reduced or prevented in the display apparatus 100.

Hereinafter, a shape of each of the panel lines will be described with reference to FIGS. 10 to 13.

Referring to FIGS. 10 and 13, the first row panel lines PSL1 to PSL6 may be connected to the first row panel pads PPDL, respectively. Also, the second row panel lines PSH1 to PSH6 may be connected to the second row panel pads PPDH, respectively.

The first row panel lines PSL1 to PSL6 and the second row panel lines PSH1 to PSH6 may be alternately disposed in the first direction DR1.

The second row panel pads PPDH may sequentially include first to sixth-second row panel pads PPDH1 to PPDH6. The first-second row panel pad PPDH1 may be a pad of the second row panel pads PPDH that is closest to the display area DA. The sixth-second row panel pad PPDH6 may be a pad of the second row panel pads PPDH that is farthest away from the display area DA. The second row panel lines PSH1 to PSH6 may be connected to the first to sixth-second row panel pads PPDH1 to PPDH6, respectively.

The first row panel pads PPDL may sequentially include first to sixth-first row panel pads PPDL1 to PPDL6. The first-first row panel pad PPDL1 may be a pad of the first row panel pads PPDL that is closest to the display area DA. The sixth-first row panel pad PPDL6 may be a pad of the first row panel pads PPDL that is farthest away from the display area DA. The first row panel lines PSL1 to PSL6 may be connected to the first to sixth-first row panel pads PPDL1 to PPDL6, respectively.

The first row panel line PSL1 may pass between the first-second row panel pad PPDH1 and the second-second row panel pad PPDH2. The second-first row panel line PSL2 may pass between the second and third-second row panel pads PPDH2 and PPDH3. The third-first row panel line PSL3 may pass between the third and fourth-second row panel pads PPDH3 and PPDH4. The fourth-first row panel line PSL4 may pass between the fourth and fifth-second row panel pads PPDH4 and PPDH5. The fifth-first row panel line PSL5 may pass between the fifth and sixth-second row panel pads PPDH5 and PPDH6.

Figure 14:
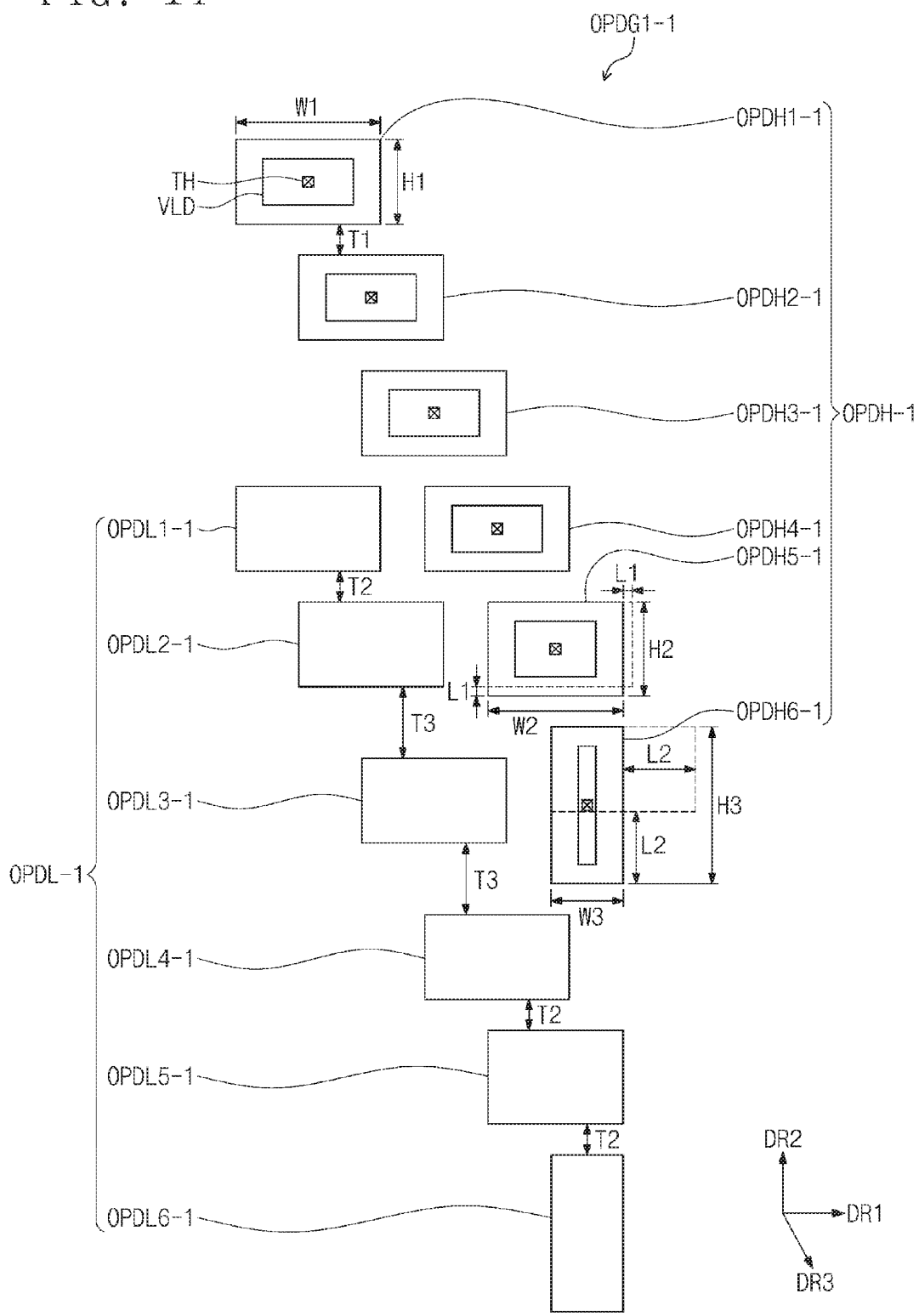
FIG. 14 is a plan view of one output pad group according to another embodiment of the inventive concept.

FIG. 14 is a plan view of one output pad group according to another embodiment of the inventive concept.

When comparing the output pad group OPDG1 of FIG. 3 with the output pad group OPDG1-1 of FIG. 14, the output pad group OPDG1-1 of FIG. 14 may include pads having shapes different from each other on a plane.

The output pad group OPDG1-1 may include first row output pads OPDL-1 and second row output pads OPDH-1. The first row output pads OPDL-1 may sequentially include first to sixth-first row output pads OPDL1-1 to OPDL6-1. The second row output pads OPDH-1 may sequentially include first to sixth-second row output pads OPDH1-1 to OPDH6-1.

One first row output pad OPDL-1 and one second row output pad OPDH-1, which are spaced apart from each other in the second direction DR2 and disposed at a same position, may have the same or substantially the same shape. For example, the first-first row output pad OPDL1-1 and the first-second row output pad OPDH1-1 may have the same or substantially the same shape.

In another embodiment of the inventive concept, the first row output pads OPDL-1 and the second row output pads OPDH-1 may have first to third shapes, respectively.

For example, each of the first to fourth-first row output pads OPDL1-1 to OPDL4-1 may have the first shape, the fifth-first row output pad OPDL5-1 may have the second shape, and the sixth-first row output pad OPDL6-1 may have the third shape. Similarly, each of the first to fourth-second row output pads OPDH1-1 to OPDH4-1 may have the first shape, the fifth-second row output pad OPDH5-1 may have the second shape, and the sixth-second row output pad OPDH6-1 may have the third shape.

The first shape has a first width W1 in the first direction DR1 and a first height H1 in the second direction DR2. The second shape has a second width W2 in the first direction DR1 and a second height H2 in the second direction DR2. The second width W2 may be less than the first width W1 by a first length L1. The second height H2 may be greater than the first height H1 by the first length L1.

The third shape has a third width W3 in the first direction DR1 and a third height H3 in the second direction DR2. The third width W3 may be less than the first width W1 by a second length L2. The third height H3 may be greater than the first height H1 by the second length L2.

The second row output pads OPDH-1 may be spaced by a first distance T1 from each other in the second direction DR2.

The first row output pads OPDL-1 may be spaced by a distance, which is different from the above-described distance, from each other. For example, the first and second-first row output pads OPDL1-1 and OPDL2-1 may be spaced by a second distance T2 from each other in the second direction DR2, and the second and third-first row output pads OPDL2-1 and OPDL3-1 may be spaced by a third distance T3 from each other in the second direction DR2. The third and fourth-first row output pads OPDL3-1 and OPDL4-1 may be spaced by the third distance T3 from each other in the second direction DR2. The fourth and fifth-first row output pads OPDL4-1 and OPDL5-1 may be spaced by the second distance T2 from each other in the second direction DR2. The fifth and sixth-first row output pads OPDL5-1 and OPDL6-1 may be spaced by the second distance T2 from each other in the second direction DR2. The first distance T1 may be equal or substantially equal to the second distance T2.

When comparing the output pad group OPDG1 of FIG. 3 with the output pad group OPDG1-1 of FIG. 14, the output pad group OPDG1-1 of FIG. 14 may have a width that is reduced in the first direction DR1. Thus, in the display apparatus 100 according to an embodiment of the inventive concept, more output pad groups may be disposed on the flexible printed circuit board 120 in the first direction DR1.

Figure 15:
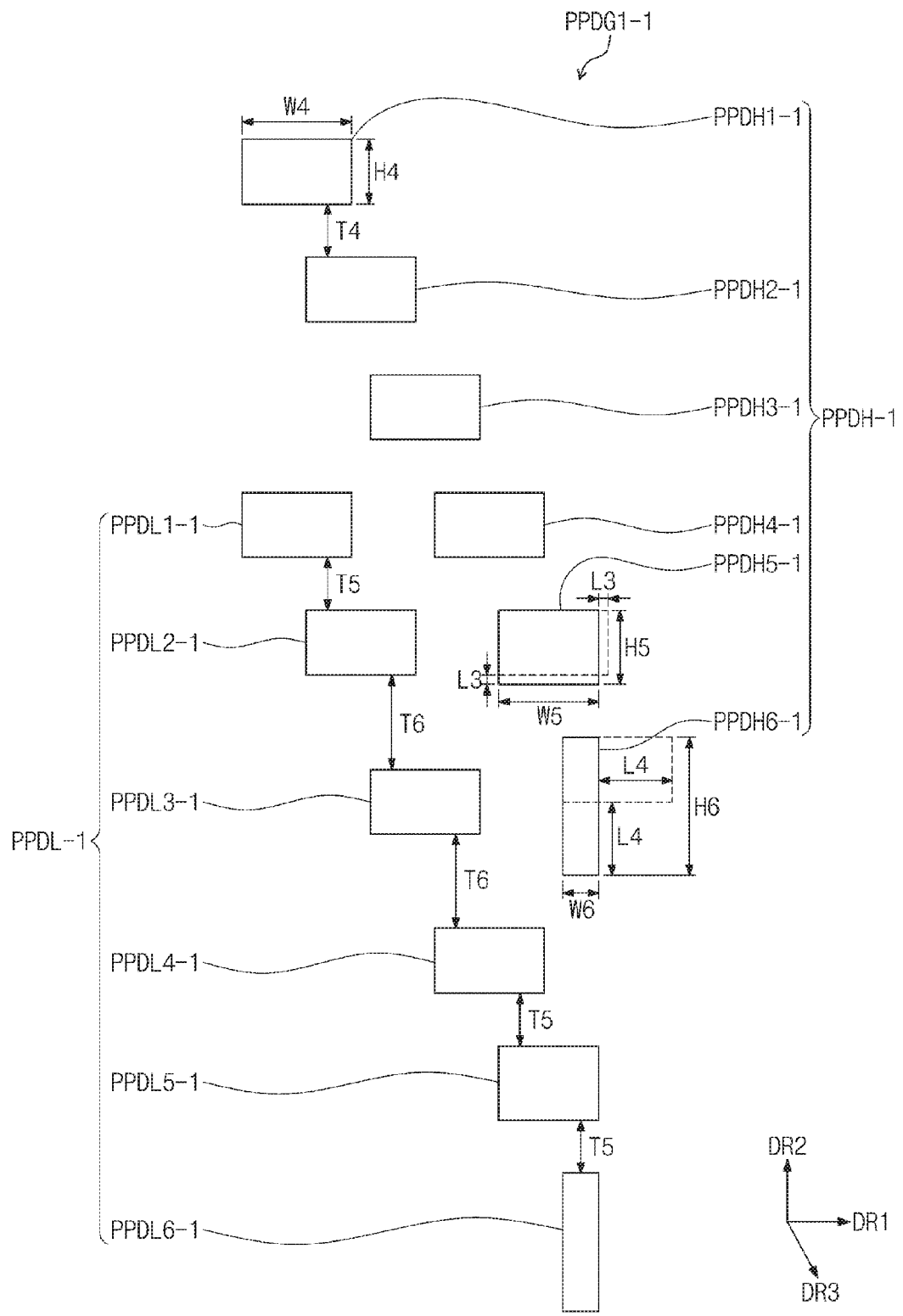
FIG. 15 is a plan view of the panel pads corresponding to the output pad group of FIG. 14.

FIG. 15 is a plan view of the panel pads corresponding to the output pad group of FIG. 14.

When comparing the panel pad group PPDG1 of FIG. 10 with the panel pad group PPDG1-1 of FIG. 15, the panel pad group PPDG1-1 of FIG. 15 may include pads having shapes different from each other on a plane.

The panel pad group PPDG1-1 may include first row panel pads PPDL-1 and second row panel pads PPDH-1. The first row panel pads PPDL-1 may sequentially include first to sixth-first row panel pads PPDL1-1 to PPDL6-1. The second row panel pads PPDH-1 may sequentially include first to sixth-second row panel pads PPDH1-1 to PPDH6-1.

One first row panel pad PPDL-1 and one second row panel pad PPDH-1, which are spaced apart from each other in the second direction DR2 and disposed at a same position in the first direction DR1, may have the same or substantially the same shape. For example, the first-first row panel pad PPDL1-1 and the first-second row panel pad PPDH1-1 may have the same or substantially the same shape.

In another embodiment of the inventive concept, the first row panel pads PPDL-1 and the second row panel pads PPDH-1 may have fourth to sixth shapes, respectively.

For example, each of the first to fourth-first row panel pads PPDL1-1 to PPDL4-1 may have the fourth shape, the fifth-first row panel pad PPDL5-1 may have the fifth shape, and the sixth-first row panel pad PPDL6-1 may have the sixth shape. Similarly, each of the first to fourth-second row panel pads PPDH1-1 to PPDH4-1 may have the fourth shape, the fifth-second row panel pad PPDH5-1 may have the fifth shape, and the sixth-second row panel pad PPDH6-1 may have the sixth shape.

The fourth shape has a fourth width W4 in the first direction DR1 and a fourth height H4 in the second direction DR2. The fifth shape has a fifth width W5 in the first direction DR1, and a fifth height H5 in the second direction DR2. The fifth width W5 may be less by a third length L3 than the fourth width W4. The fifth height H5 may be greater by the third length L3 than the fourth height H4.

The sixth shape has a sixth width W6 in the first direction DR1 and a sixth height H6 in the second direction DR2. The sixth width W6 may be less by a fourth length L4 than the fourth width W4. The sixth height H6 may be greater by the fourth length L4 than the fourth height H4.

The second row panel pads PPDH-1 may be spaced by a fourth distance T4 from each other in the second direction DR2.

The first row panel pads PPDL-1 may be spaced by a distance, which is different from the above-described distance, from each other. For example, the first and second-first row panel pads PPDL1-1 and PPDL2-1 may be spaced by a fifth distance T5 from each other in the second direction DR2, and the second and third-first row panel pads PPDL2-1 and PPDL3-1 may be spaced by a sixth distance T6 from each other in the second direction DR2. The third and fourth-first row panel pads PPDL3-1 and PPDL4-1 may be spaced by the sixth distance T6 from each other in the second direction DR2. The fourth and fifth-first row panel pads PPDL4-1 and PPDL5-1 may be spaced by the fifth distance T5 from each other in the second direction DR2. The fifth and sixth-first row panel pads PPDL5-1 and PPDL6-1 may be spaced by the fifth distance T5 from each other in the second direction DR2. The fourth distance T4 may be equal to or substantially equal to the fifth distance T5.

When comparing the panel pad group PPDG1 of FIG. 10 with the panel pad group PPDG1-1 of FIG. 15, the panel pad group PPDG1-1 of FIG. 15 may have a width that is reduced in the first direction DR1. Thus, in the display apparatus 100 according to another embodiment of the inventive concept, more output pad groups may be disposed within the mounting areas MA of the display panel 110 in the first direction DR1.

Figure 16:
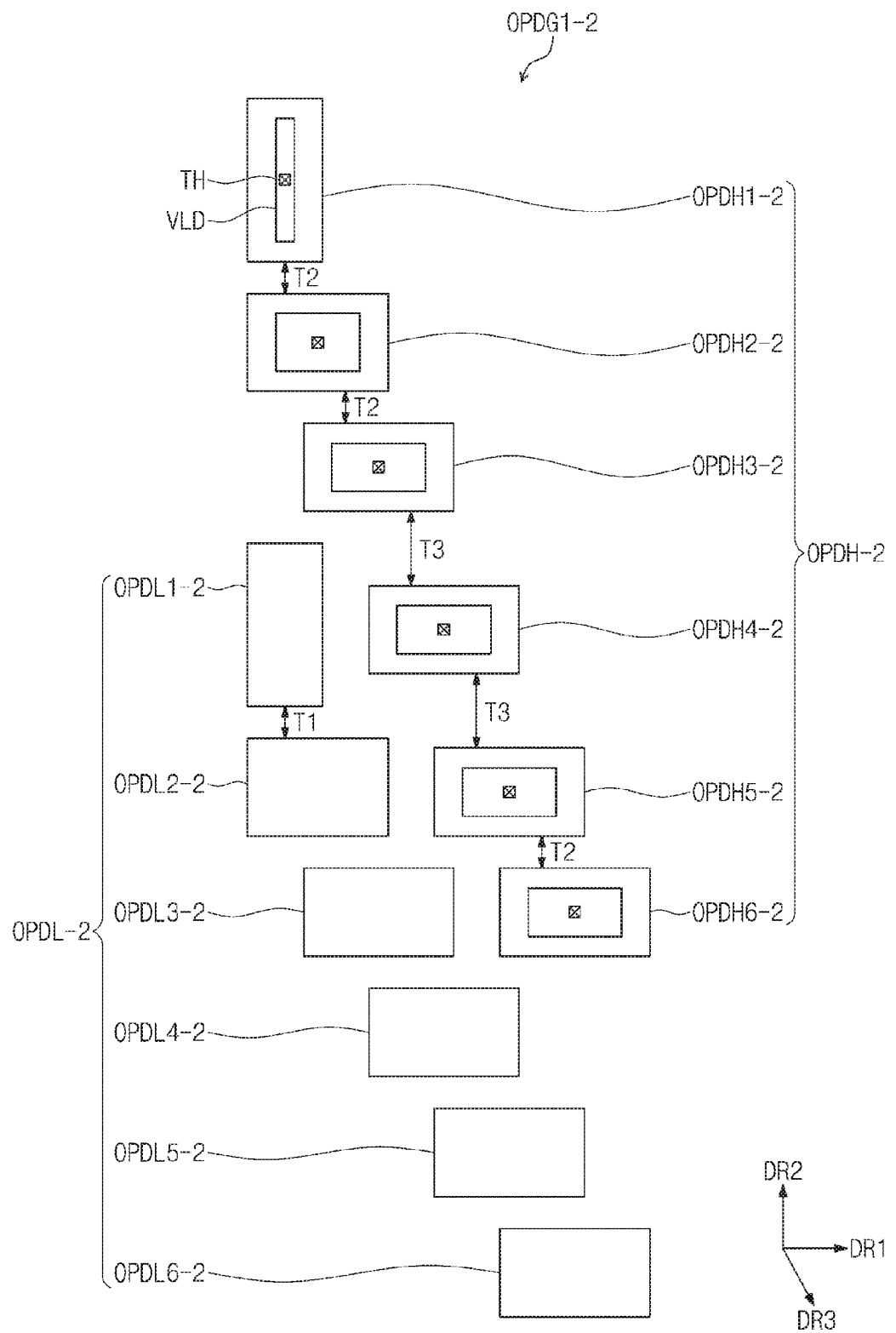
FIG. 16 is a plan view of one output pad group according to another embodiment of the inventive concept.

FIG. 16 is a plan view of one output pad group according to another embodiment of the inventive concept.

When comparing the output pad group OPDG1-1 of FIG. 14 with the output pad group OPDG1-2 of FIG. 16, the output pad group OPDG1-2 of FIG. 16 may include pads having shapes different from each other.

In FIG. 16, the first-second row output pad OPDH1-2 may have the third shape, the second-second row output pad OPDH2-2 may have the second shape, and the third-second row output pad OPDH3-2 to the sixth-second row output pad OPDH6-2 may have the first shape.

In FIG. 16, the first row output pads OPDL-2 may be spaced by the first distance T1 from each other in the second direction DR2.

The first and second-second row output pads OPDH1-2 and OPDH2-2 may be spaced by the second distance T2 from each other in the second direction DR2. The second and third-second row output pads OPDH2-2 and OPDH3-2 may be spaced by the second distance T2 from each other in the second direction DR2. The third and fourth-second row output pads OPDH3-2 and OPDH4-2 may be spaced by the third distance T3 from each other in the second direction DR2. The fourth and fifth-second row output pads OPDH4-2 and OPDH5-2 may be spaced by the third distance T3 from each other in the second direction DR2. The fifth and sixth-second row output pads OPDH5-2 and OPDH6-2 may be spaced by the second distance T2 from each other in the second direction DR2. The first distance T1 may be equal to or substantially equal to the second distance T2.

When comparing the output pad group OPDG1 of FIG. 3 with the output pad group OPDG1-2 of FIG. 16, the output pad group OPDG1-2 of FIG. 16 may have a width that is reduced in the first direction DR1. Thus, in the display apparatus 100 according to another embodiment of the inventive concept, more output pad groups may be disposed on the flexible printed circuit board 120 in the first direction DR1.

Figure 17:
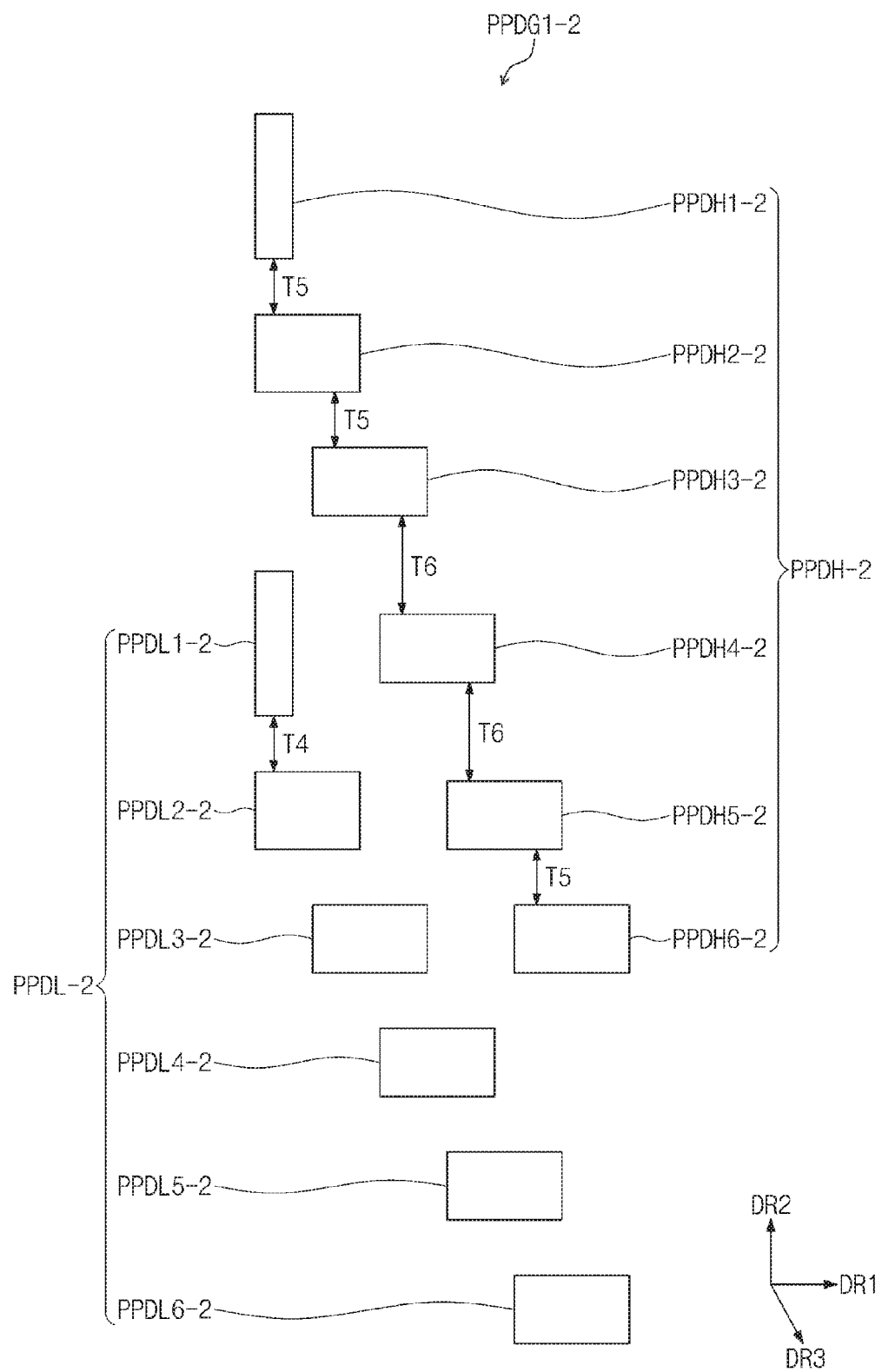
FIG. 17 is a plan view of the pad panels corresponding to the output pad group of FIG. 16.

FIG. 17 is a plan view of the pad panels corresponding to the output pad group of FIG. 16.

When comparing the panel pad group PPDG1-1 of FIG. 15 with the panel pad group PPDG1-2 of FIG. 17, the panel pad group PPDG1-2 of FIG. 17 may include pads having different shapes.

In FIG. 17, the first-first row panel pad PPDH1-2 may have the sixth shape, the second-first row panel pad PPDH2-2 may have the fifth shape, and the third-first row panel pad PPDH3-2 to the sixth-first row panel pad PPDH6-2 may have the fourth shape.

In FIG. 17, the first row panel pads PPDL-2 may be spaced by the fourth distance T4 from each other in the second direction DR2.

The first and second-second row panel pads PPDH1-2 and PPDH2-2 may be spaced by the fifth distance T5 from each other in the second direction DR2. The second and third-second row panel pads PPDH2-2 and PPDH3-2 may be spaced by the fifth distance T5 from each other in the second direction DR2. The third and fourth-second row panel pads PPDH3-2 and PPDH4-2 may be spaced by the sixth distance T6 from each other in the second direction DR2. The fourth and fifth-second row panel pads PPDH4-2 and PPDH5-2 may be spaced by the sixth distance T6 from each other in the second direction DR2. The fifth and sixth-second row panel pads PPDH5-2 and PPDH6-2 may be spaced by the fifth distance T5 from each other in the second direction DR2. The fourth distance T4 may be equal to or substantially equal to the fifth distance T5.

When comparing the panel pad group PPDG1 of FIG. 10 with the panel pad group PPDG1-2 of FIG. 17, the panel pad group PPDG1-2 of FIG. 17 may have a width that is reduced in the first direction DR1. Thus, in the display apparatus 100 according to another embodiment of the inventive concept, more output pad groups may be disposed within the mounting areas MA of the display panel 110 in the first direction DR1.

Figure 18:
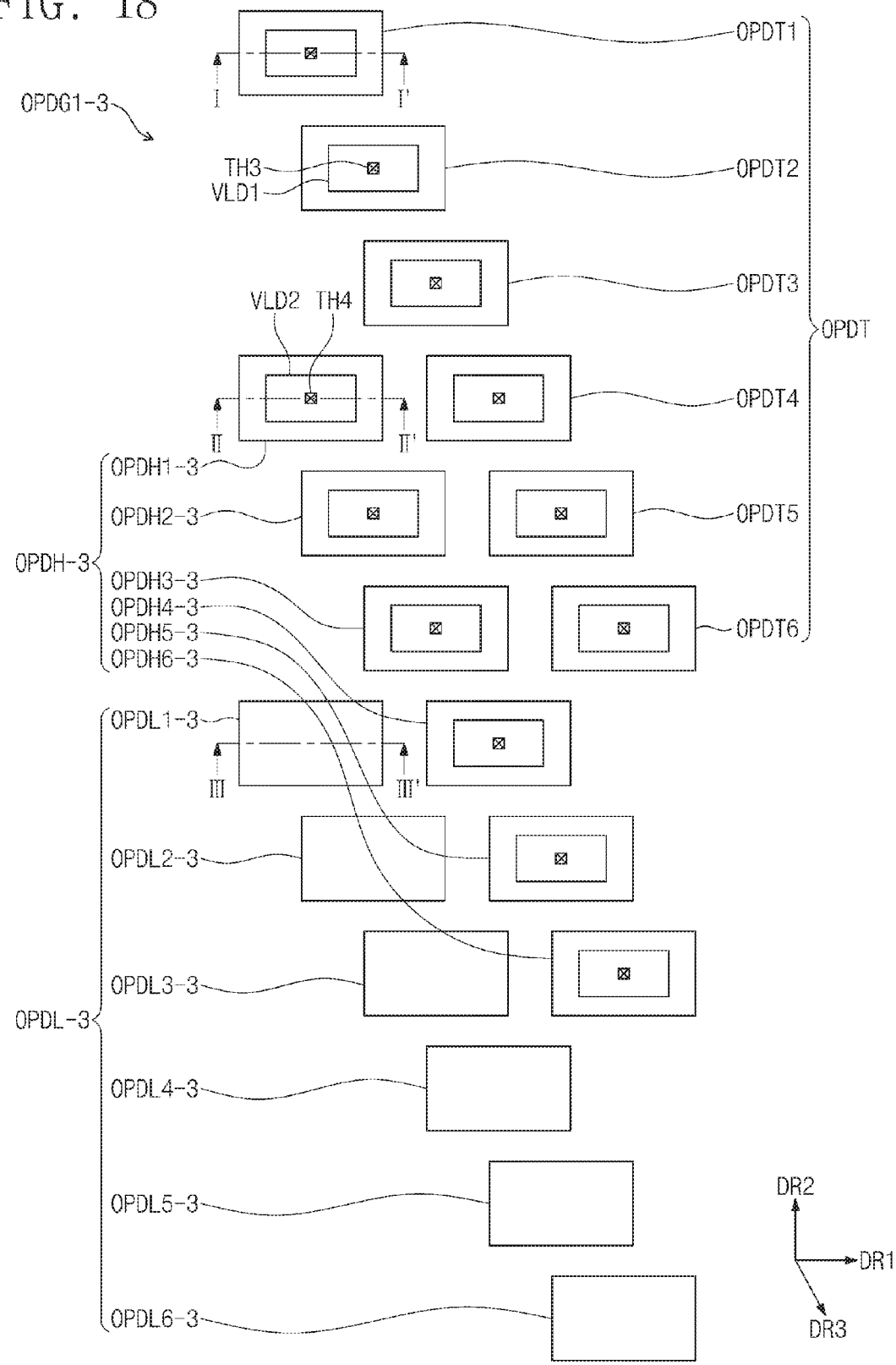
FIG. 18 is a plan view of one output pad group according to another embodiment of the inventive concept.

FIG. 18 is a plan view of one output pad group according to another embodiment of the inventive concept.

When comparing the output pad group OPDG1 of FIG. 3 with the output pad group OPDG1-3 of FIG. 18, the output pad group OPDG1-3 of FIG. 18 may include first to third row output pads OPDL-3, OPDH-3, and OPDT. Hereinafter, the first to third row output pads OPDL-3, OPDH-3, and OPDT will be described with reference with FIG. 18 as an example. However, the inventive concept is not limited thereto. For example, the output pad group according to another embodiment of the inventive concept may include output pads that are arranged in four or more rows.

The first row output pads OPDL-3 may be arranged in the third direction DR3. The first row output pads OPDL-3 may include first to sixth-first row output pads OPDL1-3 to OPDL6-3.

The second row output pads OPDH-3 may be arranged in the third direction DR3. The second row output pads OPDH-3 may include first to sixth-second row output pads OPDH1-3 to OPDH6-3. The second row output pads OPDH-3 may be spaced apart from the first row output pads OPDL-3.

The third row output pads OPDT may be arranged in the third direction DR3. The third row output pads OPDT may include first to sixth-third row output pads OPDT1 to OPDT6. The third row output pads OPDT may be spaced apart from the first and second row output pads OPDL-3 and OPDH-3.

Each of the second row output pads OPDH-3 may be disposed at a position corresponding to (e.g., that is spaced by) a distance (e.g., a predetermined distance) from each of the first row output pads OPDL-3 in the second direction DR2. Each of the third row output pads OPDT may be disposed at a position corresponding to (e.g., that is spaced by) a distance (e.g., a predetermined distance) from each of the first row output pads OPDL-3 in the second direction DR2.

Figure 19:
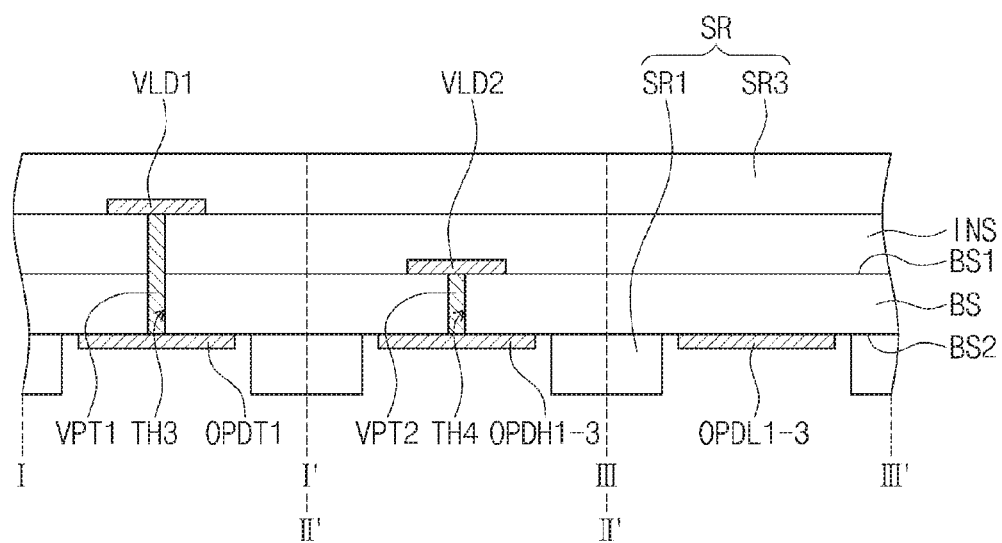
FIG. 19 is a cross-sectional view taken along each of the lines I-I', and III-III' of FIG. 18.

FIG. 19 is a cross-sectional view taken along each of the lines I-I', and III-III' of FIG. 18.

Referring to FIGS. 18 and 19, the flexible line board may include a base substrate BS, an insulation layer INS, first via lands VLD1, second via lands VLD2, first via patterns VPT1, second via patterns VPT2, and a solder resistors SR.

The first row output pads OPDL-3, the second row output pads OPDH-3, and the third row output pads OPDT may be disposed on the other surface BS2 of the base substrate BS. The first row output pads OPDL-3, the second row output pads OPDH-3, and the third row output pads OPDT may be disposed on the same layer.

The insulation layer INS may be disposed on one surface BS1 of the base substrate BS.

The first via lands VLD1 may be disposed on the insulation layer INS. The first via lands VLD1 may overlap with the third row output pads OPDT, respectively. Each of the third row output pads OPDT may have an area greater than that of each of the corresponding first via lands VLD1.

First through holes TH3 may be defined in the base substrate BS and the insulation layer INS, respectively. Each of the first through holes TH3 may overlap with one third row output pad OPDT and one first via land VLD1, which correspond to each other.

The first via patterns VPT1 may be disposed in the first through holes TH3, respectively. Each of the first via patterns VPT1 may pass through the base substrate BS to contact one of the third row output pads OPDT and one of the first via lands VLD1, which overlap with each other. Each of the first via patterns VPT1 may be formed of a conductive material, and may connect one of the third row output pads OPDT and one of the first via lands VLD1 to each other, which overlap with each other.

The second via lands VLD2 may be disposed on the one surface BS1 of the base substrate BS. The second via lands VLD2 may overlap with the second row output pads OPDH-3, respectively. Each of the second row output pads OPDH-3 may have an area greater than that of each of the corresponding second via lands VLD2.

Second through holes TH4 may be defined in the base substrate BS. Each of the second through holes TH4 may overlap with one second row output pad OPDH-3 and one second via land VLD2, which correspond to each other.

The second via patterns VPT2 may be disposed in the second through holes TH4, respectively. Each of the second via patterns VPT2 may pass through the base substrate BS to contact one of the second row output pads OPDH-3 and one of the second via lands VLD2, which overlap with each other. Each of the second via patterns VPT2 may be formed of a conductive material to electrically connect one of the second row output pads OPDH-3 to one of the second via lands VLD2, which overlap with each other.

The solder resistor SR may include a first solder resistor SR1 and a third solder resistor SR3.

The first solder resistor SR1 may be disposed on the other surface BS2 of the base substrate BS. The first solder resistor SR1 may cover lines disposed on the other surface BS2 of the base substrate BS. Openings for exposing each of the first to third row output pads OPDL-3, OPDH-3, and OPDT may be defined in the first solder resistor SR1.

The third solder resistor SR3 may be disposed on the one surface BS1 of the base substrate BS. The third solder resistor SR3 may cover lines disposed on the one surface BS1 of the base substrate BS.

Figure 20:
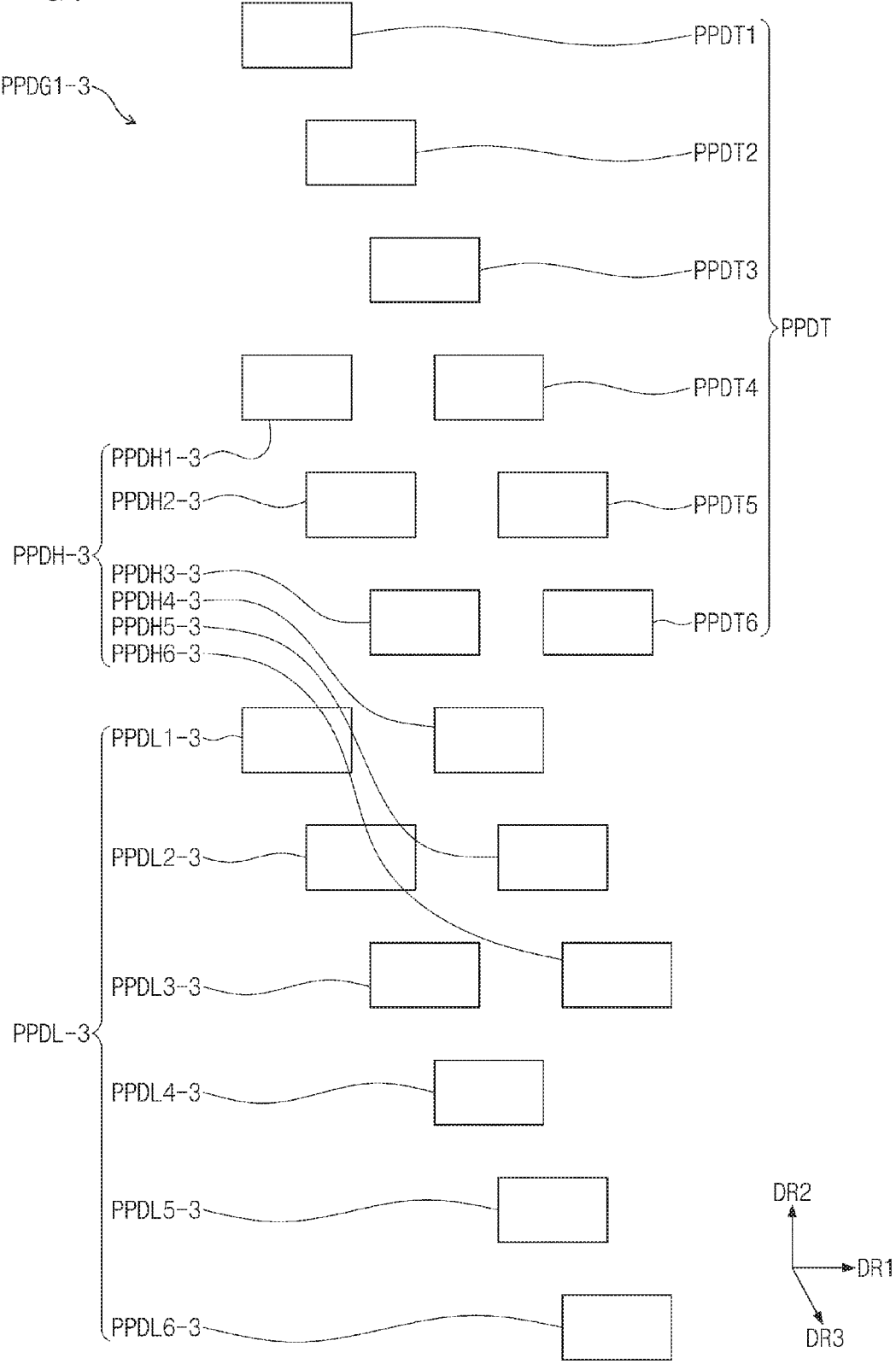
FIG. 20 is a plan view of the pad panels corresponding to the output pad group of FIG. 18.

FIG. 20 is a plan view of the pad panels corresponding to the output pad group of FIG. 18.

When comparing the panel pad group PPDG1 of FIG. 10 with the panel pad group PPDG1-3 of FIG. 20, the panel pad group PPDG1-3 of FIG. 20 may include first to third row panel pads PPDL-3, PPDH-3, and PPDT. Hereinafter, the first to third row panel pads PPDL-3, PPDH-3, and PPDT will be described with reference with FIG. 20 as an example. However, the inventive concept is not limited thereto. For example, the panel pad group according to another embodiment of the inventive concept may include panel pads that are arranged in four or more rows.

The first row panel pads PPDL-3 may be arranged in the third direction DR3. The first row panel pads PPDL-3 may include first to sixth-first row panel pads PPDL1-3 to PPDL6-3.

The second row panel pads PPDH-3 may be arranged in the third direction DR3. The second row panel pads PPDL-3 may include first to sixth-second row panel pads PPDH1-3 to PPDH6-3. The second row panel pads PPDH-3 may be spaced apart from the first row panel pads PPDL-3.

The third row panel pads PPDT may be arranged in the third direction DR3. The third row panel pads PPDT may include first to sixth-third row panel pads PPDT1 to PPDT6. The third row panel pads PPDT may be spaced apart from the first and second row panel pads PPDL-3 and PPDH-3.

Each of the second row panel pads PPDH-3 may be disposed at a position corresponding to (e.g., that is spaced by) a distance (e.g., a predetermined distance) from each of the first row panel pads PPDL-3 in the second direction DR2. Each of the third row panel pads PPDT may be disposed at a position corresponding to (e.g., that is spaced by) a distance (e.g., a predetermined distance) from each of the first row panel pads PPDL-3 in the second direction DR2.

In the display apparatus according to one or more embodiments of the inventive concept, the area on which the pads are disposed of each of the printed circuit board and the display panel may be reduced.

In the display apparatus according to one or more embodiments of the inventive concept, more pads may be disposed on the limited area of each of the printed circuit board and the display panel.

In the display apparatus according to one or more embodiments of the inventive concept, the flow path of the conductive adhesion material may be controlled to prevent or substantially prevent a difference in resistance and adhesion force for each area of the flexible printed circuit board from occurring.

In the display apparatus according to one or more embodiments of the inventive concept, the bonding failures between the flexible printed circuit board and the display panel when being bonded may be prevented or reduced.

Although the inventive concept has been described with reference to the example embodiments, those skilled in the art will recognize that various changes and modifications to the described embodiments may be performed, all without departing from the spirit and scope of the present invention. Furthermore, those skilled in the various arts will recognize that the inventive concept described herein will suggest solutions to other tasks and adaptations for other applications. It is the applicant's intention to cover by the claims herein, all such uses of the inventive concept, and those changes and modifications which could be made to the example embodiments of the inventive concept herein chosen for the purpose of disclosure, all without departing from the spirit and scope of the present invention. Thus, the example embodiments of the inventive concept should be considered in all respects as illustrative and not restrictive, with the spirit and scope of the present invention being indicated by the appended claims, and their equivalents.

What is claimed is:

1. A printed circuit board comprising:
   a base substrate having two adjacent sides that respectively extend in first and second directions crossing each other, and a plurality of pad group areas arranged in the first direction on the base substrate;
   first row pads disposed within each of the pad group areas and arranged in a third direction crossing the first and second directions;
   second row pads disposed within each of the pad group areas, arranged in the third direction, and spaced from the first row pads on a plane;
   first lines on a same layer as that of the first row pads and respectively connected to the first row pads; and
   lower dummy lines on the same layer as that of the first lines and spaced from the first and second row pads on the plane,
   wherein each of the pad group areas is divided into first, second, and third pad areas that are sequentially arranged in the second direction, and
   wherein some of the first row pads are in the first pad area, rest of the first row pads and some of the second row pads are in the second pad area, and rest of the second row pads are in the third pad area.

2. The printed circuit board of claim 1, wherein the first lines and the lower dummy lines extend in the second direction within the pad group areas.

3. The printed circuit board of claim 1, wherein the lower dummy lines are configured to be electrically floated.

4. The printed circuit board of claim 1, wherein the lower dummy lines are disposed within the pad group areas on the plane.

5. The printed circuit board of claim 1, further comprising a driving circuit chip on the base substrate,
   wherein the first lines are connected between the first row pads and the driving circuit chip.

6. The printed circuit board of claim 5, wherein some of the lower dummy lines are between some of the first row pads and some of the second row pads on the plane, and
   others of the lower dummy lines are between the second row pads and a first edge of the pad group areas, the first edge being farther away from the driving circuit chip in the second direction on the plane than other edges of the pad group areas.

7. The printed circuit board of claim 5, further comprising:
   via lands on one surface of the base substrate; and
   via patterns overlapping with the via lands and passing through the base substrate to be respectively connected to the second row pads,
   wherein the first row pads, the second row pads, the first lines, and the lower dummy lines are on another surface of the base substrate opposite to the one surface of the base substrate.

8. The printed circuit board of claim 7, further comprising:
   second upper lines on the one surface of the base substrate and respectively connected to the via lands;
   second lower lines on the another surface of the base substrate and connected to the driving circuit chip; and
   second via patterns passing through the base substrate to connect each of the second upper lines to each of the second lower lines.

9. The printed circuit board of claim 8, further comprising upper dummy lines on a same layer as that of the second upper lines and spaced from the first and second row pads on the plane.

10. The printed circuit board of claim 9, wherein the second upper lines and the upper dummy lines extend in the second direction within the pad group areas.

11. The printed circuit board of claim 9, wherein the upper dummy lines are configured to be electrically floated.

12. The printed circuit board of claim 9, wherein the upper dummy lines are disposed within the pad group areas on the plane.

13. The printed circuit board of claim 9, wherein some of the upper dummy lines are between some of the first row pads and some of the second row pads on the plane, and
    others of the upper dummy lines are between the second row pads and a first edge of the pad group areas, the first edge being farther away from the driving circuit chip in the second direction on the plane than other edges of the pad group areas.

14. A display apparatus comprising:
    a printed circuit board having two adjacent sides that respectively extend in first and second directions crossing each other, and a plurality of pad group areas arranged in the first direction on the printed circuit board; and
    a display panel electrically connected to the printed circuit board t rough the pad group areas,
    wherein the printed circuit board comprises:
      first row pads disposed within each of the pad group areas and arranged in a third direction crossing the first and second directions;
      second row pads disposed within each of the pad group areas, arranged in the third direction, and spaced from the first row pads;
      first lines on a same layer as that of the first row pads and respectively connected to the first row pads; and
      lower dummy lines on the same layer as that of the first lines and spaced from the first and second row pads on a plane,
    wherein each of the pad group areas is divided into first, second, and third pad areas that are sequentially arranged in the second direction, and
    wherein some of the first row pads are in the first pad area, rest of the first row pads and some of the second row pads are in the second pad area, and rest of the second row pads are in the third pad area.

15. The display apparatus of claim 14, wherein the display panel comprises:
    first row panel pads respectively overlapping with the first row pads on the plane; and
    second row panel pads respectively overlapping with the second row pads on the plane, wherein some of the first row panel pads are on the first pad area, rest of the first row panel pads and some of the second row panel pads are on the second pad area, and rest of the second row panel pads are on the third pad area.

16. The display apparatus of claim 14, wherein the lower dummy lines are disposed within the pad group areas on the plane, and the lower dummy lines are configured to be electrically floated.

17. A printed circuit board comprising:
a base substrate having two adjacent sides that respectively extend in first and second directions crossing each other, and a plurality of pad group areas arranged in the first direction on the base substrate;
via lands on one surface of the base substrate;
first row pads on another surface of the base substrate opposite to the one surface of the base substrate within each of the pad, group areas on a plane, the first row pads being arranged in a third direction crossing the first and second directions;
second row pads on the another surface of the base substrate within each of the pad group areas on the plane, arranged in the third direction, and spaced from the first row pads on the plane;
via patterns overlapping with the via lands and passing through the base substrate to be respectively connected to the second row pads;
second upper lines on a same layer as that of the via lands and respectively connected to the via lands; and
upper dummy lines on the same layer as that of the second upper lines and spaced from the first and second row pads on the plane,
wherein each of the pad group areas is divided into first, second, and third pad areas that are sequentially arranged in the second direction, and
wherein some of the first row pads are in the first pad area, rest of the first row pads and some of the second row pads are in the second pad area, and rest of the second row pads are in the third pad area.

18. The printed circuit board of claim 17, wherein the upper dummy lines are disposed within the pad group areas on the plane, and the upper dummy lines are configured to be electrically floated.

19. The printed circuit board of claim 17, wherein the second upper lines and the upper dummy lines extend in the second direction within the pad group areas.

20. The printed circuit board of claim 17, further comprising a driving circuit chip on the base substrate,
wherein the second upper lines are connected between the second row pads and the driving circuit chip,
wherein some of the upper dummy lines are between some of the first row pads and some of the second row pads on the plane, and
others of the upper dummy lines are between the second row pads and a first edge of the pad group areas, the first edge being farther away from the driving circuit chip in the second direction on the plane than other edges of the pad group areas.

21. The display apparatus of claim 14, further comprising a conductive adhesion material between the display panel and the printed circuit board,
wherein the lower dummy lines are configured to control a flow path of the conductive adhesion material when the display panel is bonded to the printed circuit board via the conductive adhesion material.

22. The printed circuit board of claim 1, wherein at least one of the first row pads has a width in the first direction that is shorter than that of another one of the first row pads.

23. The printed circuit board of claim 1, wherein at least one of the first row pads has a height in the second direction that is longer than that of another one of the first row pads.

24. The printed circuit board of claim 1, wherein at least one of the first row pads has a width in the first direction that is shorter than that of another one of the first row pads by a first distance, and a length in the second direction that is longer than that of the another one of the first row pads by the first distance.

25. The printed circuit board of claim 24, wherein each of the first row pads are separated from each other in the second direction by a same distance, and some of the second row pads are separated from each other in the second direction by a distance different than that of others of the second row pads.

* * * * *